United States Patent
Aihara

(10) Patent No.: US 8,060,662 B2
(45) Date of Patent: Nov. 15, 2011

(54) RECORDING CONTROL APPARATUS, RECORDING CONTROL METHOD, AND COMPUTER PROGRAM PRODUCT

(75) Inventor: Takashi Aihara, Saitama (JP)

(73) Assignee: Ricoh Company, Ltd., Tokyo (JP)

( * ) Notice: Subject to any disclaimer, the term of this patent is extended or adjusted under 35 U.S.C. 154(b) by 254 days.

(21) Appl. No.: 12/335,839

(22) Filed: Dec. 16, 2008

(65) Prior Publication Data

US 2009/0157911 A1 Jun. 18, 2009

(30) Foreign Application Priority Data

Dec. 17, 2007 (JP) ................................. 2007-325161
Nov. 28, 2008 (JP) ................................. 2008-305337

(51) Int. Cl.
*G06F 3/00* (2006.01)

(52) U.S. Cl. ......... 710/8; 710/2; 710/9; 710/10; 710/13; 710/15; 710/301; 710/302

(58) Field of Classification Search ......................... None
See application file for complete search history.

(56) References Cited

U.S. PATENT DOCUMENTS

| | | | | |
|---|---|---|---|---|
| 5,650,949 A | * | 7/1997 | Kishimoto | 702/155 |
| 5,805,800 A | * | 9/1998 | Kotani et al. | 726/27 |
| 6,604,153 B2 | * | 8/2003 | Imamura et al. | 710/36 |
| 6,789,138 B1 | * | 9/2004 | Yoshizawa | 710/16 |
| 7,209,642 B1 | * | 4/2007 | Utsumi | 386/94 |

FOREIGN PATENT DOCUMENTS

| | | | |
|---|---|---|---|
| JP | 4-294075 | | 10/1992 |
| JP | 6-259939 | | 9/1994 |
| JP | 08-153998 | * | 6/1996 |
| JP | 2000-347776 | | 12/2000 |
| JP | 2005-174474 | | 6/2005 |

\* cited by examiner

*Primary Examiner* — Tanh Nguyen

(74) *Attorney, Agent, or Firm* — Oblon, Spivak, McClelland, Maier & Neustadt, L.L.P.

(57) ABSTRACT

A determining unit performs a position determination determining whether a nonvolatile memory is mounted in a right position or in a wrong position. When the determining unit determines that the nonvolatile memory is mounted in the wrong position, a protecting unit protects data stored in the nonvolatile memory.

12 Claims, 15 Drawing Sheets

RECORDING CONTROL APPARATUS, RECORDING CONTROL METHOD, AND COMPUTER PROGRAM PRODUCT

CROSS-REFERENCE TO RELATED APPLICATIONS

The present application claims priority to and incorporates by reference the entire contents of Japanese priority document 2007-325161 filed in Japan on Dec. 17, 2007 and Japanese priority document 2008-305337 filed in Japan on Nov. 28, 2008.

BACKGROUND OF THE INVENTION

1. Field of the Invention

The present invention relates to a recording control apparatus, a recording control method, and a computer program product.

2. Description of the Related Art

In a typical multifunction product (MFP), a nonvolatile random access memory (NVRAM) for storing therein user information and charging information is removably mounted on a control board. Therefore, when the control board has a trouble and needs to be replaced to a new one, the NVRAM removed from the old control board can be mounted on the new control board. With the functional increase of an MFP, a plurality of NVRAM devices is generally mounted on a control board in the MFP.

However, for example, when a service person replaces the control board with a new one, he or she may set the NVRAM devices in wrong positions on the new control board by mistake because the NVRAM devices have the same shape, although the NVRAM devices can be distinguished from one another by labels affixed thereto or the like.

If the NVRAM devices are mounted in the wrong positions, hardware terminals are configured not to be damaged by the improper mountings. However, an address different from each storage module is assigned to each of memory areas of each of the NVRAM devices by software, so that when the MFP is powered on, and a boot process of the MFP is started, it may cause the access to the incorrect NVRAM device due to the improper mountings of the NVRAM devices. As a result, for example, important user information stored in the NVRAM device may be lost or rewritten.

In conventional technologies, data stored in each of the NVRAM devices can be checked, for example, based on the sum of data values of which. However, even if the NVRAM devices are mounted in the wrong positions, the sum of data values is the same. Therefore, it is not possible to detect that the NVRAM devices are mounted in the wrong positions.

To solve such problems, there have been developed various technologies. As an example of the technologies, there is provided a circuit for determining each of modules. However, this technology disadvantageously increases in cost. As another example of the technologies, NVRAM devices are configured to be physically incompatible with one another. However, in this technology, the NVRAM devices or sockets of which need to be physically processed, resulting in the lack in versatility and the increase in production cost.

Furthermore, a disk recording/reproducing apparatus disclosed in Japanese Patent Application Laid-open No. H6-259939 is configured to verify whether a disk identification data (ID) stored in a main body of the apparatus and a disk ID recorded in a sub data area of a disk are matched. When the disk IDs are mismatched, the disk recording/reproducing apparatus write-protects the disk so that data stored in the main body of which, such as the disk ID and edit data, is protected from being copied onto the disk, and displays an alarm message. The disk recording/reproducing apparatus ensures an arbitrary timing of recording disk management information or the like on the disk and the security of recording information stored therein.

Moreover, Japanese Patent Application Laid-open No. 2005-174474 discloses a data protecting method of a recording apparatus. In this method, at the factory, a computer program or data is encoded with an error correcting code, and the encoded computer program or data is written on the recording apparatus. In addition, check data is also encoded with the error correcting code, and the encoded check data is written in an unused area of the recording apparatus. When the recording apparatus is marketed, the encoded computer program or data and the encoded check data are decoded, and the absence of error is checked. By this method, the recording apparatus can protect data stored therein securely.

However, in the technologies disclosed in Japanese Patent Application Laid-open No. H6-259939 and Japanese Patent Application Laid-open No. 2005-174474, there are described about how data is checked and the timing of recording the data, but not described about the protection of data stored in an improperly-mounted device. Therefore, there is a possibility of loss of data.

SUMMARY OF THE INVENTION

It is an object of the present invention to at least partially solve the problems in the conventional technology.

According to one aspect of the present invention, there is provided a recording control apparatus including a removable nonvolatile memory; a determining unit that performs a position determination determining whether the nonvolatile memory is mounted in a right position or in a wrong position; and a protecting unit that protects data stored in the nonvolatile memory when the determining unit determines that the nonvolatile memory is mounted in the wrong position.

Furthermore, according to another aspect of the present invention, there is provided a method of controlling data recording in a recording control apparatus that includes a removable nonvolatile memory. The method includes determining whether the nonvolatile memory is mounted in a right position or in a wrong position in the recording control apparatus; and protecting data stored in the nonvolatile memory when it is determined that the nonvolatile memory is mounted in the wrong position.

Moreover, according to still another aspect of the present invention, there is provided a computer program product including a computer-usable medium having computer-readable program codes embodied in the medium for controlling data recording in a recording control apparatus that includes a removable nonvolatile memory. The program codes when executed cause a computer to execute determining whether the nonvolatile memory is mounted in a right position or in a wrong position in the recording control apparatus; and protecting data stored in the nonvolatile memory when it is determined that the nonvolatile memory is mounted in the wrong position.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the accompanying drawings.

Figure 1:
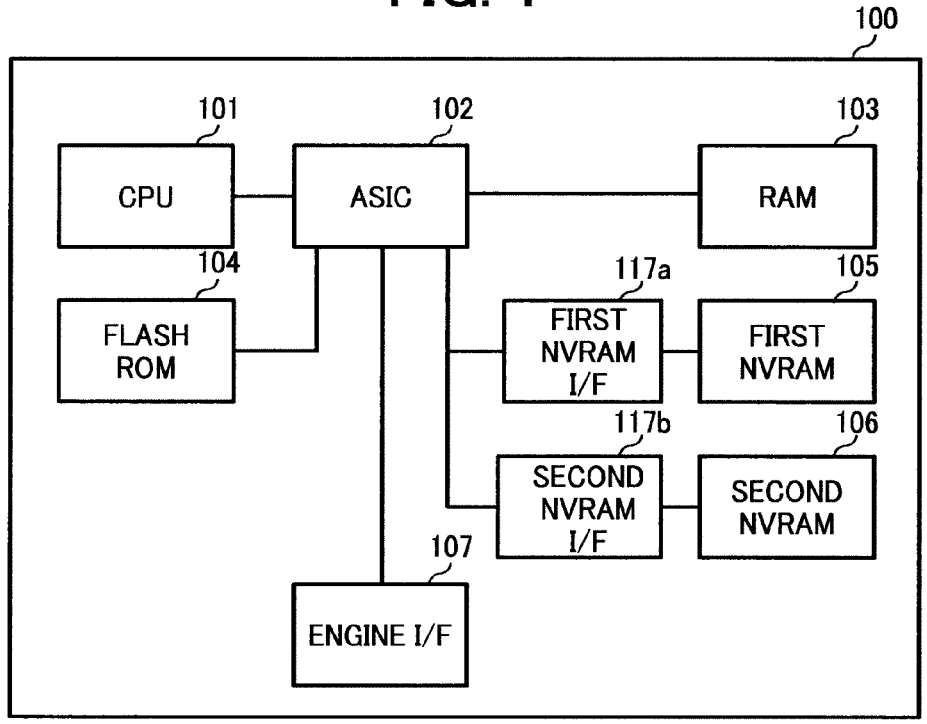
FIG. 1 is a block diagram of a hardware configuration of a recording control apparatus according to a first embodiment of the present invention.

FIG. 1 is a block diagram of a hardware configuration of a recording control apparatus 100 according to a first embodiment of the present invention. The recording control apparatus 100 includes a central processing unit (CPU) 101, an application specific integrated circuit (ASIC) 102, a random access memory (RAM) 103, a flash read-only memory (ROM) 104, a first NVRAM 105, a second NVRAM 106, a first NVRAM interface (I/F) 117a, a second NVRAM I/F 117b, and an engine I/F 107.

In the present embodiment, the recording control apparatus 100 is installed in an image forming apparatus. However, the present invention is not limited to the image forming apparatus. The recording control apparatus 100 can be applied to any apparatuses as long as the apparatuses include a memory. Incidentally, the image forming apparatus means any of a copier, a scanner, a facsimile machine, a printer, and an MFP.

The ASIC 102 controls buses connecting among devices included in the recording control apparatus 100 and a bus connecting the recording control apparatus 100 to an external I/F, and also controls direct memory access (DMA) transfer of bitmap data.

The RAM 103 is a volatile memory. The RAM 103 is set aside for a working memory of the CPU 101, an input buffer for input data, a page memory for print data, and the like. When a boot process of the image forming apparatus is started, data stored in each of the first and second NVRAMs 105 and 106 is copied onto the RAM 103.

The flash ROM 104 is a nonvolatile memory. The flash ROM 104 stores therein a control program for controlling the recording control apparatus 100 and various data, such as data on an image correcting pattern used for image correction, data on fonts, and the like.

The engine I/F 107 is an interface connecting the recording control apparatus 100 to a printer engine.

The first and second NVRAM I/Fs 117a and 117b are interfaces to which the first and second NVRAMs 105 and 106 are attached. Namely, when the first NVRAM 105 is attached to the first NVRAM I/F 117a, and the second NVRAM 106 is attached to the second NVRAM I/F 117b, it means that the first and second NVRAMs 105 and 106 are mounted in their right positions. If the first NVRAM 105 is attached to the second NVRAM I/F 117b, and the second NVRAM 106 is attached to the first NVRAM I/F 117a, it means that the first and second NVRAMs 105 and 106 are mounted in their wrong positions.

The first and second NVRAMs 105 and 106 are removable nonvolatile memories, and removably attached to the first and second NVRAM I/Fs 117a and 117b, respectively. The first and second NVRAMs 105 and 106 store therein various setting values of the image forming apparatus, information on an intermediate result of a job being processed just before the image forming apparatus is powered off, and the like. The first and second NVRAMs 105 and 106 store therein different information from each other.

Figure 15:
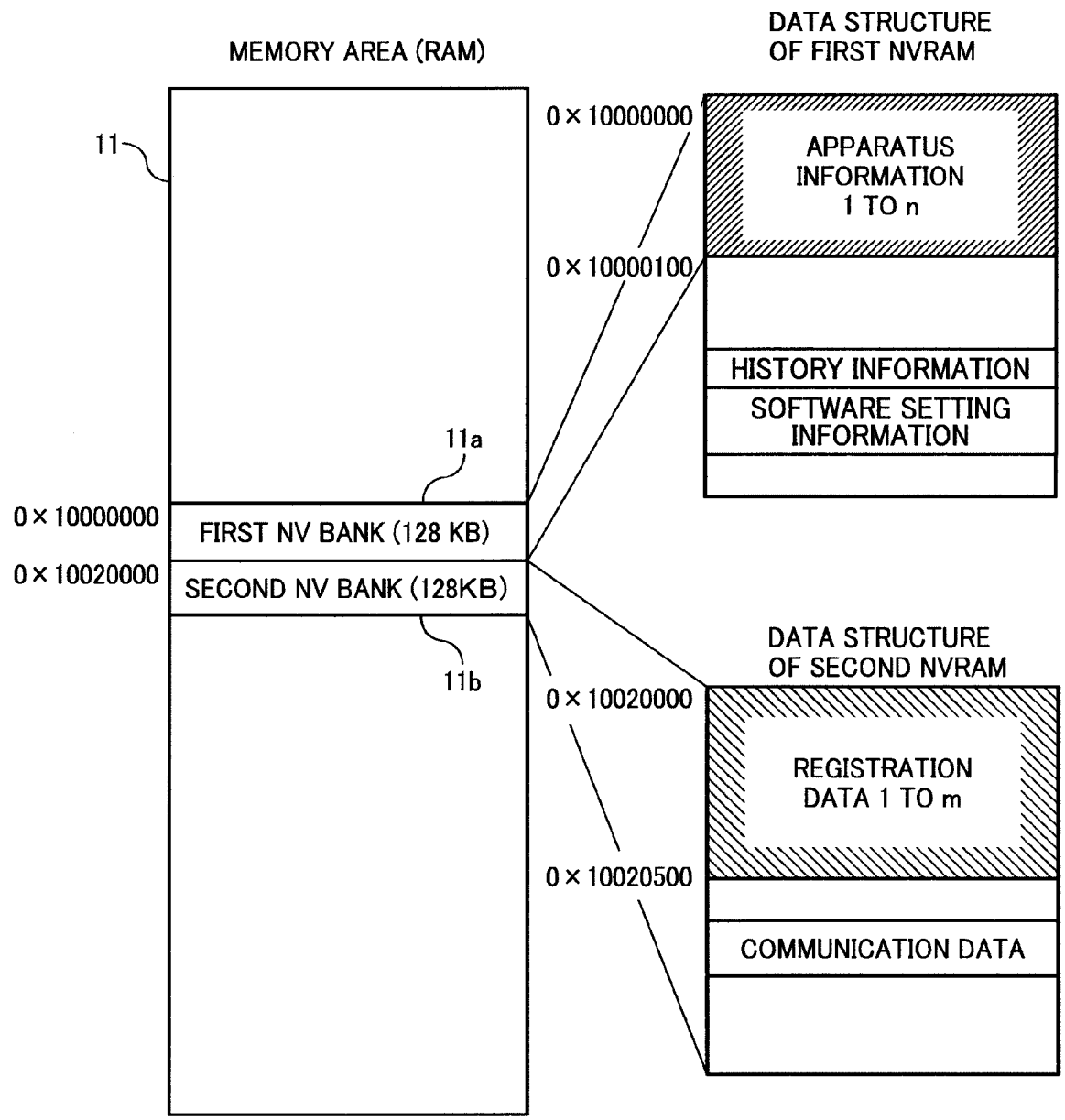
FIG. 15 is an explanatory diagram of an example of a memory area of a RAM and a data structure of each of NVRAMs in a conventional recording control apparatus.

FIG. 15 is an explanatory diagram of an example of a memory area 11 of the RAM 103 and a data structure of each of the first and second NVRAMs 105 and 106 when the first and second NVRAMs 105 and 106 are mounted in the right positions on a control board, i.e., attached to the first and second NVRAM I/Fs 117a and 117b properly in a conventional recording control apparatus. When the boot process of the image forming apparatus is started, data stored in the first NVRAM 105 is copied onto a first NV bank 11a in the memory area 11 of the RAM 103, and data stored in the second NVRAM 106 is copied onto a second NV bank 11b in the memory area 11 of the RAM 103. The first and second NVRAMs 105 and 106 store therein different information from each other as described above. In this example, the first NVRAM 105 stores therein apparatus information 1 to n, history information, and software setting information, and the second NVRAM 106 stores therein registration data 1 to m and communication data.

Figure 16:
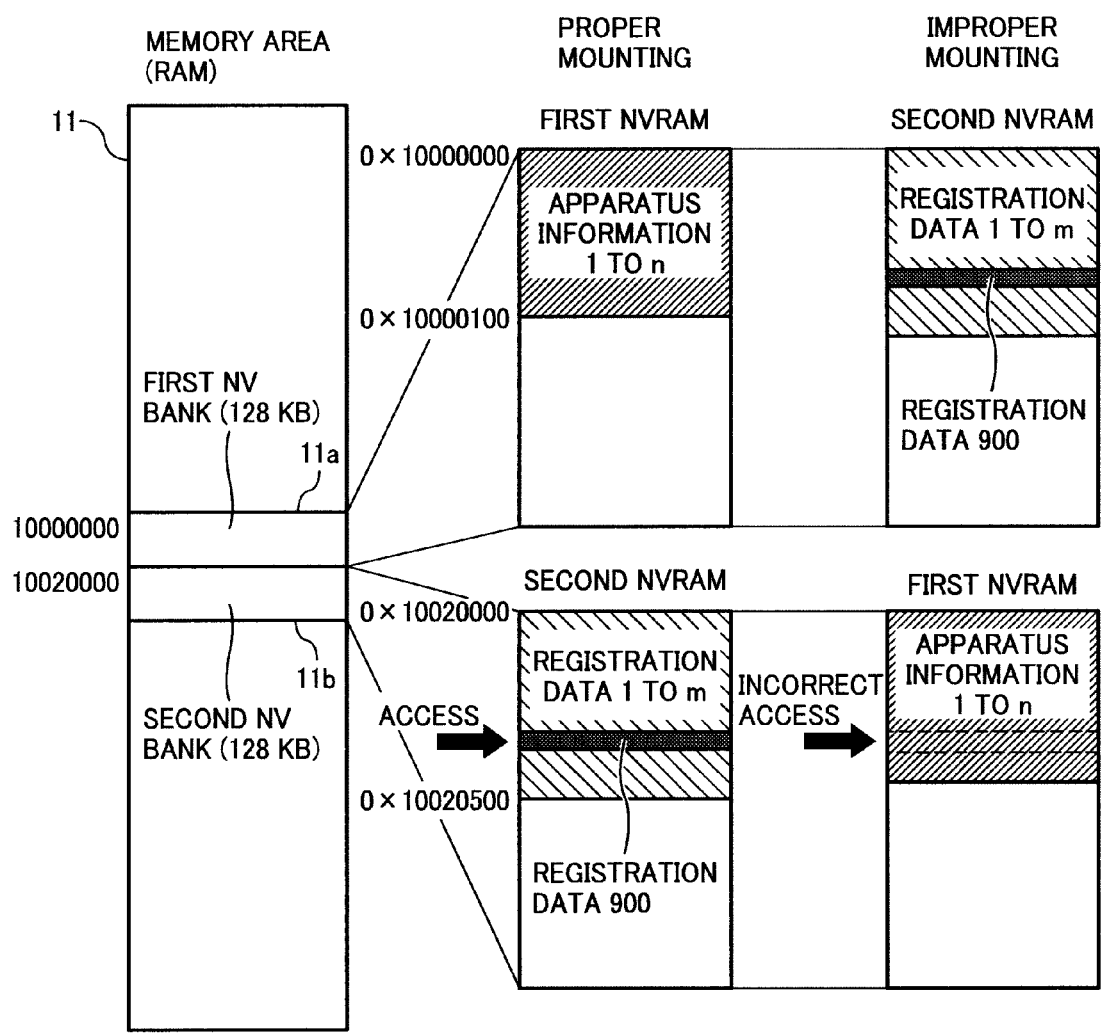
FIG. 16 is an explanatory diagram for explaining an example of incorrect access to NVRAM data due to improper mounting of the NVRAMs in the conventional recording control apparatus.

FIG. 16 is an explanatory diagram for explaining an example of incorrect access to NVRAM data due to improper mounting of the first and second NVRAMs 105 and 106 in the conventional recording control apparatus. In the improper mounting, data stored in the first NVRAM 105 is copied onto the second NV bank 11b, and data stored in the second NVRAM 106 is copied onto the first NV bank 11a. Therefore, for example, when software updates registration data 900 stored in the second NVRAM 106, the software accesses to the first NVRAM 105 incorrectly. As a result, the data stored in the first NVRAM 105 is rewritten wrongly.

Figure 2:
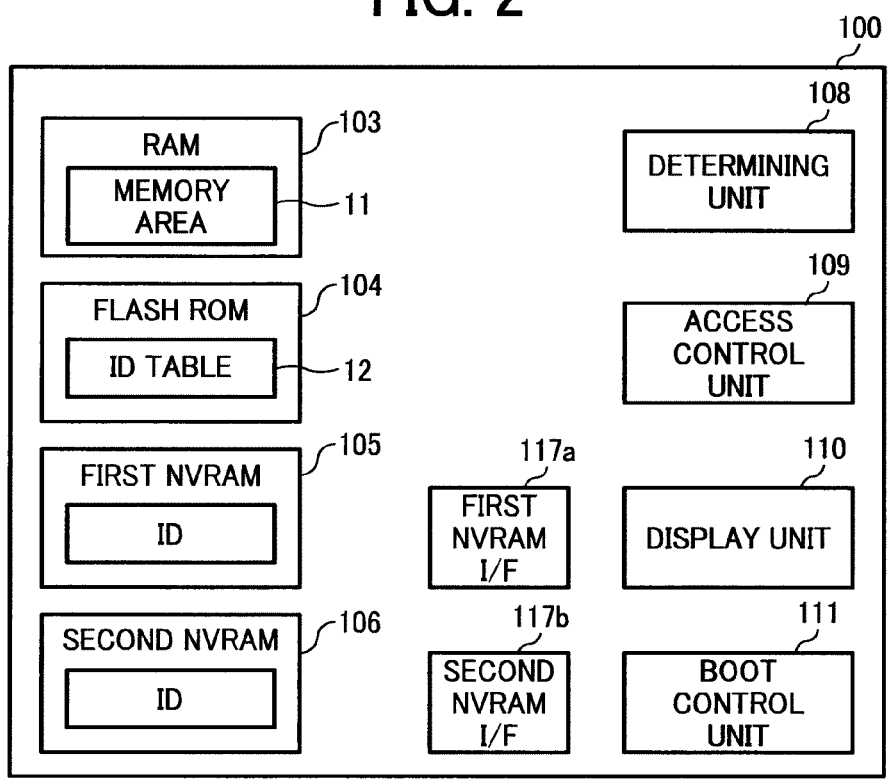
FIG. 2 is a functional block diagram of the recording control apparatus shown in FIG. 1.

FIG. 2 is a functional block diagram of the recording control apparatus 100. As shown in FIG. 2, the recording control apparatus 100 includes a determining unit 108, an access control unit 109, a display unit 110, and a boot control unit 111, the RAM 103, the flash ROM 104, the first NVRAM 105, the second NVRAM 106, the first NVRAM I/F 117a, and the second NVRAM I/F 117b.

The first and second NVRAMs 105 and 106 respectively store therein a unique ID. The IDs are uniquely assigned to the first and second NVRAMs 105 and 106 to identify the first and second NVRAMs 105 and 106.

The flash ROM 104 stores therein an ID table 12 including the IDs and sub-areas (the first and second NV banks) in the memory area 11 where data stored in the first and second NVRAMs 105 and 106 is copied in a corresponding manner. The ID table 12 will be explained in detail later.

The RAM 103 is set aside for the memory area 11. When the boot process of the image forming apparatus is started, data stored in the first and second NVRAMs 105 and 106 is copied onto the memory area 11. Specifically, when the boot process of the image forming apparatus, including the recording control apparatus 100, is started, the memory area 11 of the RAM 103 is set aside for the first and second NV banks 11a and 11b. The data stored in the first NVRAM 105, which is attached to the first NVRAM I/F 117a, is copied onto the first NV bank 11a. The data stored in the second NVRAM 106, which is attached to the second NVRAM I/F 117b, is copied onto the second NV bank 11b.

The determining unit 108 determines whether the first and second NVRAMs 105 and 106 are mounted in the right positions on the control board, i.e., are attached to the first and second NVRAM I/Fs 117a and 117b respectively by referring to the IDs stored in the first and second NVRAMs 105 and 106 and the ID table 12 stored in the flash ROM 104 when the boot process of the image forming apparatus is started. The operation of the determining unit 108 will be explained in detail later.

The access control unit 109 controls access to the data stored in the first and second NVRAMs 105 and 106. Specifically, when the determining unit 108 determines that the first and second NVRAMs 105 and 106 are mounted in the wrong positions, the access control unit 109 blocks access to the data stored in the first and second NVRAMs 105 and 106 to protect the data.

When the access control unit 109 blocks the access to the data stored in the first and second NVRAMs 105 and 106, the display unit 110 displays an error message indicating a mismatch between IDs indicated in the ID table 12 and IDs read out from the data copied onto the first and second NV banks 11a and 11b on an operation screen of the image forming apparatus, and thereby warning a user.

When the display unit 110 displays the error message, the boot control unit 111 stops the boot process of the image forming apparatus.

Figure 3:
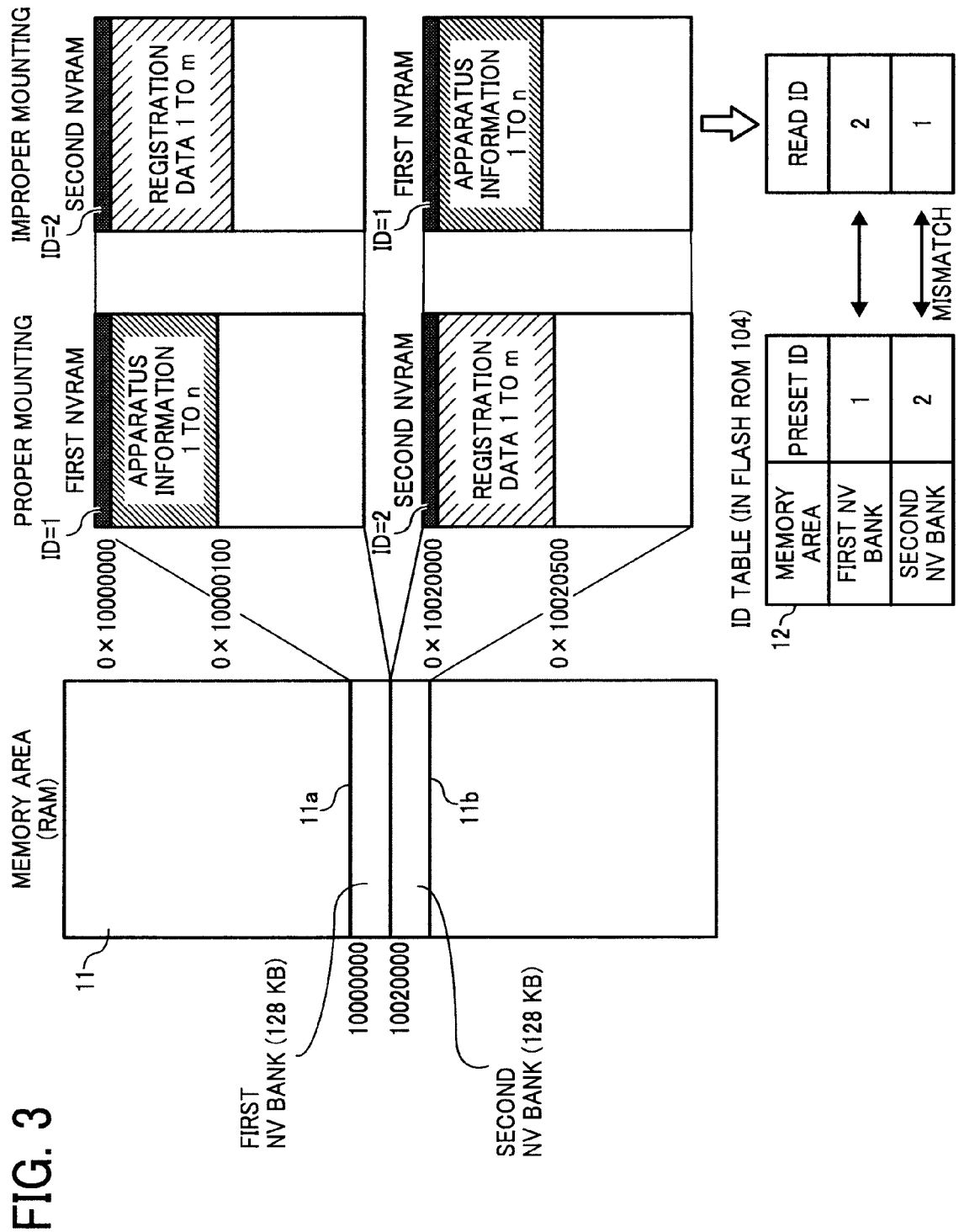
FIG. 3 is an explanatory diagram of an example of a memory area of a RAM and an ID table when two NVRAMs are mounted in the recording control apparatus according to the first embodiment.

Subsequently, the operation of the determining unit 108 is explained in detail below. FIG. 3 is an explanatory diagram of an example of the memory area 11 of the RAM 103 and the ID table 12 stored in the flash ROM 104 when the first and second NVRAMs 105 and 106 are mounted in the recording control apparatus 100. In this example, both a case where the first and second NVRAMs 105 and 106 are mounted in the right positions and a case where the first and second NVRAMs 105 and 106 are mounted in the wrong positions are illustrated. In the proper mounting, the first NVRAM 105 is attached to the first NVRAM I/F 117a, and the second NVRAM 106 is attached to the second NVRAM I/F 117b. On the other hand, in the improper mounting, the first NVRAM 105 is mistakenly attached to the second NVRAM I/F 117b, and the second NVRAM 106 is mistakenly attached to the first NVRAM I/F 117a. The ID is stored in advance in a predetermined address of each of the first and second NVRAMs 105 and 106. In this example, "ID=1" is stored in a top address of the first NVRAM 105, and "ID=2" is stored in a top address of the second NVRAM 106. In the proper mounting, when the boot process of the image forming apparatus is started, data stored in the first NVRAM 105 is copied onto the first NV bank 11a, and data stored in the second NVRAM 106 is copied onto the second NV bank 11b. However, in the improper mounting, when the boot process of the image forming apparatus is started, data stored in the second NVRAM 106 is copied onto the first NV bank 11a, and data stored in the first NVRAM 105 is copied onto the second NV bank 11b.

As shown in FIG. 3, the ID table 12 includes data on sub-areas in the memory area 11 and preset IDs in a corresponding manner. In a field of memory area, "first NV bank" and "second NV bank" are recorded as sub-areas in the memory area 11 where the first and second NVRAMs 105 and 106 are copied. Namely, the ID table 12 shown in FIG. 3 shows that the data stored in the first NVRAM 105 having the ID of 1 is stored in the first NV bank 11a, and the data stored in the second NVRAM 106 having the ID of 2 is stored in the second NV bank 11b. Incidentally, "preset ID" in the ID table 12 indicates the ID stored in each of the first and second NVRAMs 105 and 106 in advance.

The determining unit 108 determines whether the first NVRAM 105 is mounted in the right position by comparing an ID read out from the data copied onto the first NV bank 11a with the preset ID in the ID table 12. Likewise, the determining unit 108 determines whether the second NVRAM 106 is mounted in the right position by comparing an ID read out from the data copied onto the second NV bank 11b with the preset ID in the ID table 12. Such an ID read out from the data copied onto each of the first and second NV banks 11a and 11b is referred to as "a read ID". As shown in FIG. 3, when the first and second NVRAMs 105 and 106 are mounted in the wrong positions, read IDs are mismatched with the preset IDs in the ID table 12.

Figure 4:
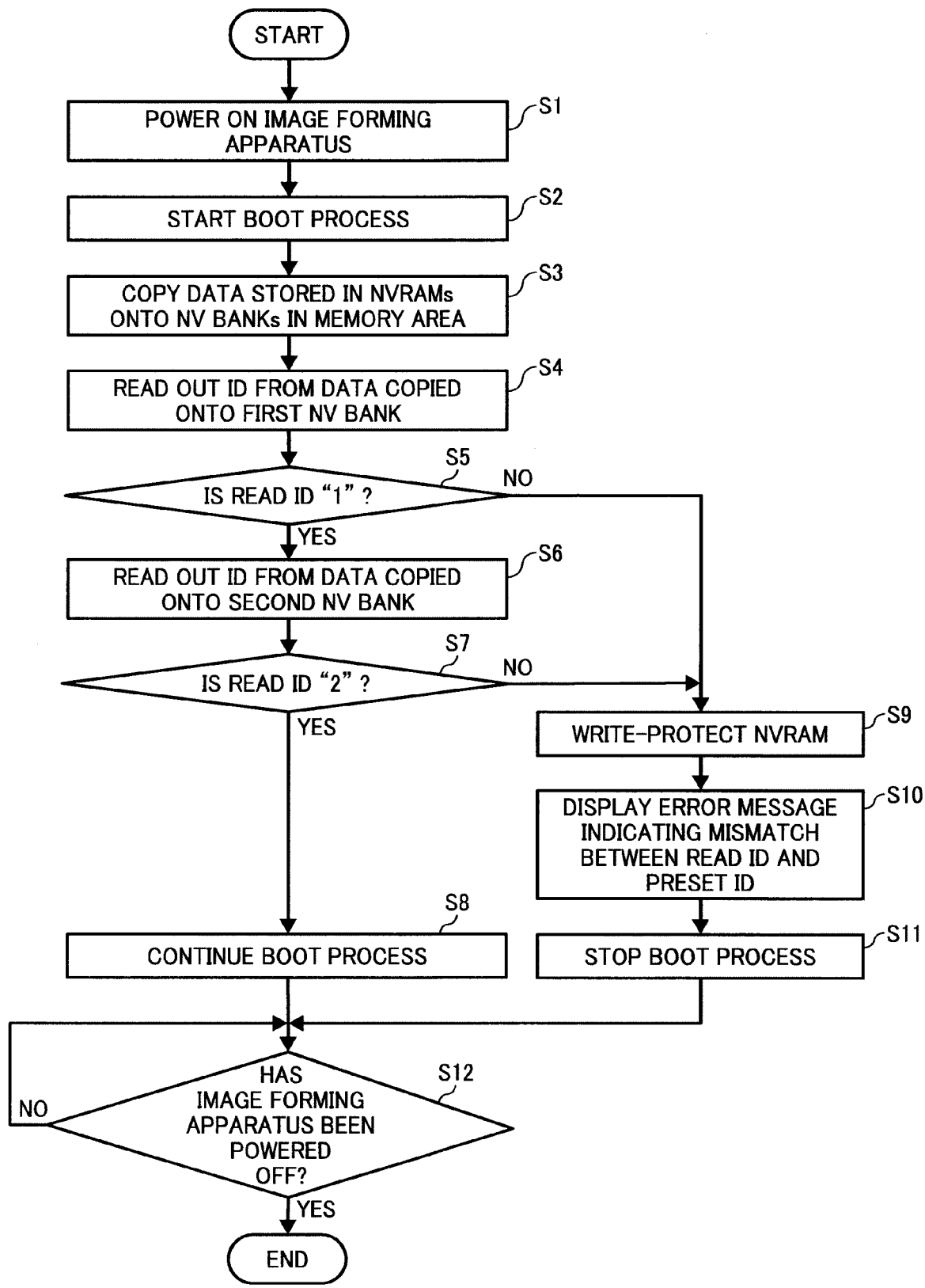
FIG. 4 is a flowchart of a data protecting process performed by the recording control apparatus according to the first embodiment.

Subsequently, a data protecting process performed by the recording control apparatus 100 is explained below with reference to a flowchart shown in FIG. 4.

When the image forming apparatus is powered on by a user (Step S1), a boot process of the image forming apparatus is started (Step S2), and the recording control apparatus 100 gets into an active state.

The CPU 101 of the recording control apparatus 100 copies data stored in an NVRAM that is attached to the first NVRAM I/F 117a onto the first NV bank 11a in the memory area 11, and copies data stored in an NVRAM that is attached to the second NVRAM I/F 117b onto the second NV bank 11b in the memory area 11 (Step S3).

After that, the determining unit 108 reads out an ID from the data copied onto the first NV bank 11a (hereinafter, "a first read ID") (Step S4), and determines whether the first read ID is "1" (Step S5).

When the first read ID is not "1" (NO at Step S5), the determining unit 108 determines that the first read ID is not matched with the preset ID in the ID table 12, and causes the access control unit 109 to write-protect the first NVRAM 105 (Step S9).

On the other hand, when the first read ID is "1" (YES at Step S5), the determining unit 108 reads out an ID from the data copied onto the second NV bank 11b (hereinafter, "a second read ID") (Step S6), and determines whether the second read ID is "2" (Step S7).

When the second read ID is not "2" (NO at Step S7), the determining unit 108 determines that the second read ID is not matched with the preset ID in the ID table 12, and causes the access control unit 109 to write-protect the second NVRAM 106 (Step S9).

When the access control unit 109 write-protects the first NVRAM 105 or the second NVRAM 106 (Step S9), the display unit 110 displays an error message indicating the mismatch between the read ID and the preset ID on the operation screen of the image forming apparatus thereby warning the user (Step S10). After that, the boot control unit 111 stops the boot process of the image forming apparatus (Step S11).

On the other hand, when the second read ID is "2" (YES at Step S7), the boot process of the image forming apparatus is continued, i.e., the boot control unit 111 does not stop the boot process of the image forming apparatus (Step S8).

After that, the boot control unit 111 confirms whether the image forming apparatus has been powered off (Step S12). When it is confirmed that the image forming apparatus has been powered off (YES at Step S12), the data protecting process performed by the recording control apparatus 100 is complete.

In this manner, in the present embodiment, it is possible to detect whether the first and second NVRAMs 105 and 106 are properly attached to the first and second NVRAM I/Fs 117a and 117b, respectively. When it is detected that the first and second NVRAMs 105 and 106 are not properly attached to the first and second NVRAM I/Fs 117a and 117b, the recording control apparatus 100 stops the boot process of the image forming apparatus. Therefore, it is possible to avoid such a situation that important information is lost due to access to the incorrect NVRAM. Furthermore, when it is detected that the first and second NVRAMs 105 and 106 are not properly attached to the first and second NVRAM I/Fs 117a and 117b, an error message indicating the mismatch between the read ID and the preset ID is displayed on the operation screen of the image forming apparatus. Therefore, a user can recognize the improper mounting of the first and second NVRAMs 105 and 106, and put back the first and second NVRAMs 105 and 106 in the right positions.

In the above first embodiment, when the first and second NVRAMs 105 and 106 are mounted in the wrong positions, data stored in the first and second NVRAMs 105 and 106 is protected by blocking the access to the data and displaying the error message on the operation screen of the image forming apparatus to warn a user. In a second embodiment, when the first and second NVRAMs 105 and 106 are mounted in the wrong positions, data stored in the first NVRAM 105 and data stored in the second NVRAM 106 are replaced by that is stored in the other NVRAM thereby protecting the data.

Figure 5:
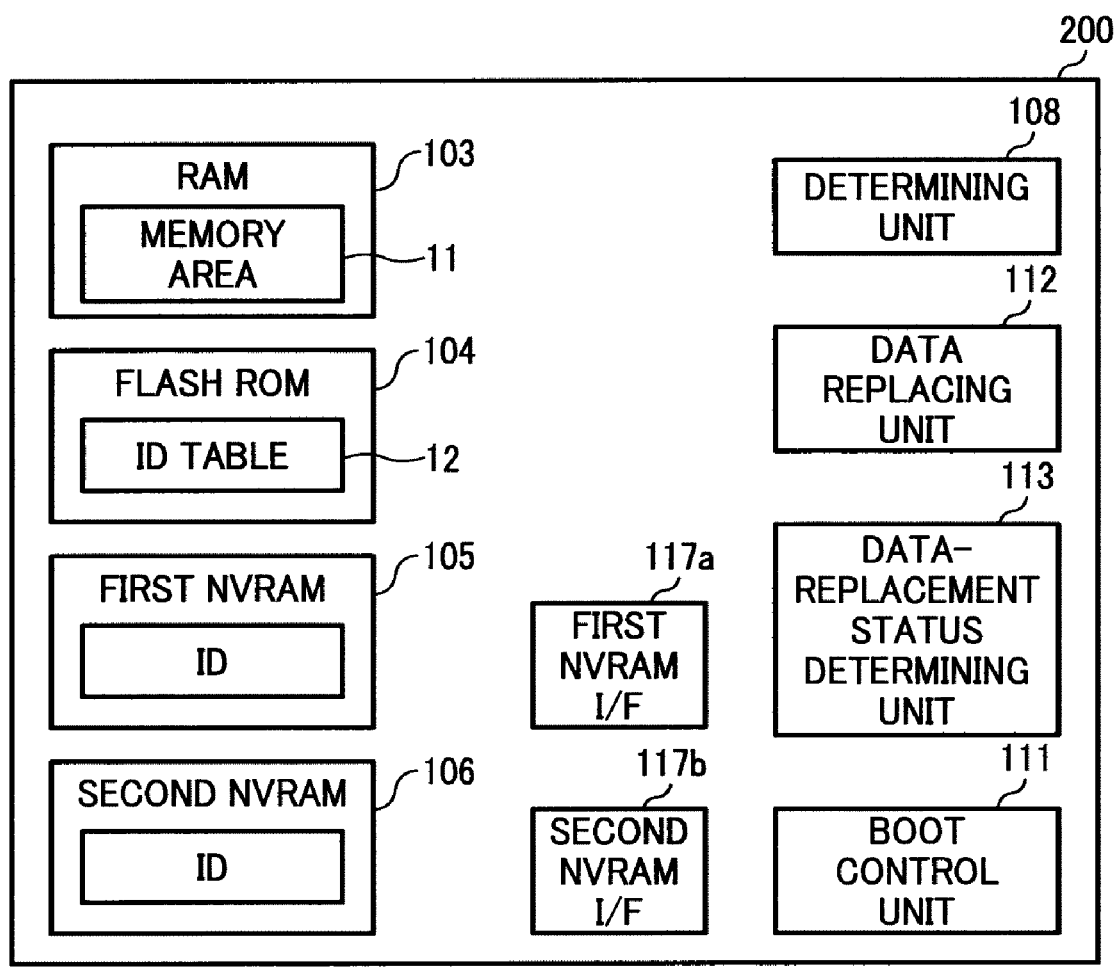
FIG. 5 is a functional block diagram of a recording control apparatus according to a second embodiment of the present invention.

FIG. 5 is a functional block diagram of a recording control apparatus 200 according to the second embodiment of the present invention. The recording control apparatus 200 includes the determining unit 108, a data replacing unit 112, a data-replacement status determining unit 113, the boot control unit 111, the RAM 103, the flash ROM 104, the first NVRAM 105, the second NVRAM 106, the first NVRAM I/F 117a, and the second NVRAM I/F 117b. The portions identical to those in FIG. 2 are denoted with the same reference numerals, and the description of those portions is omitted. Furthermore, a hardware configuration of the recording control apparatus 200 is identical to that of the recording control apparatus 100 shown in FIG. 1, and the description of the hardware configuration of the recording control apparatus 200 is omitted.

The data replacing unit 112 replaces data stored in the first and second NVRAMs 105 and 106 by that is stored in the other NVRAM when the determining unit 108 determines that the first and second NVRAMs 105 and 106 are mounted in the wrong positions. When replacing the data, the data replacing unit 112 uses the flash ROM 104 as a buffer. Furthermore, the data replacing unit 112 sets a flag indicating a copy status of the data replacement in a copy status area of the flash ROM 104 during the replacement of the data.

When the boot process of the image forming apparatus is started, the data-replacement status determining unit 113 refers to the flag set in the copy status area by the data replacing unit 112, and determines whether to continue the boot process depending on the status of the data replacement. Therefore, even when the boot process of the image forming apparatus is stopped in the middle of the data replacement, the data replacement can be restarted immediately when the image forming apparatus is rebooted.

When the data replacing unit 112 has completed the data replacement of the first and second NVRAMs 105 and 106, the boot control unit 111 boots up the image forming apparatus.

Figure 6:
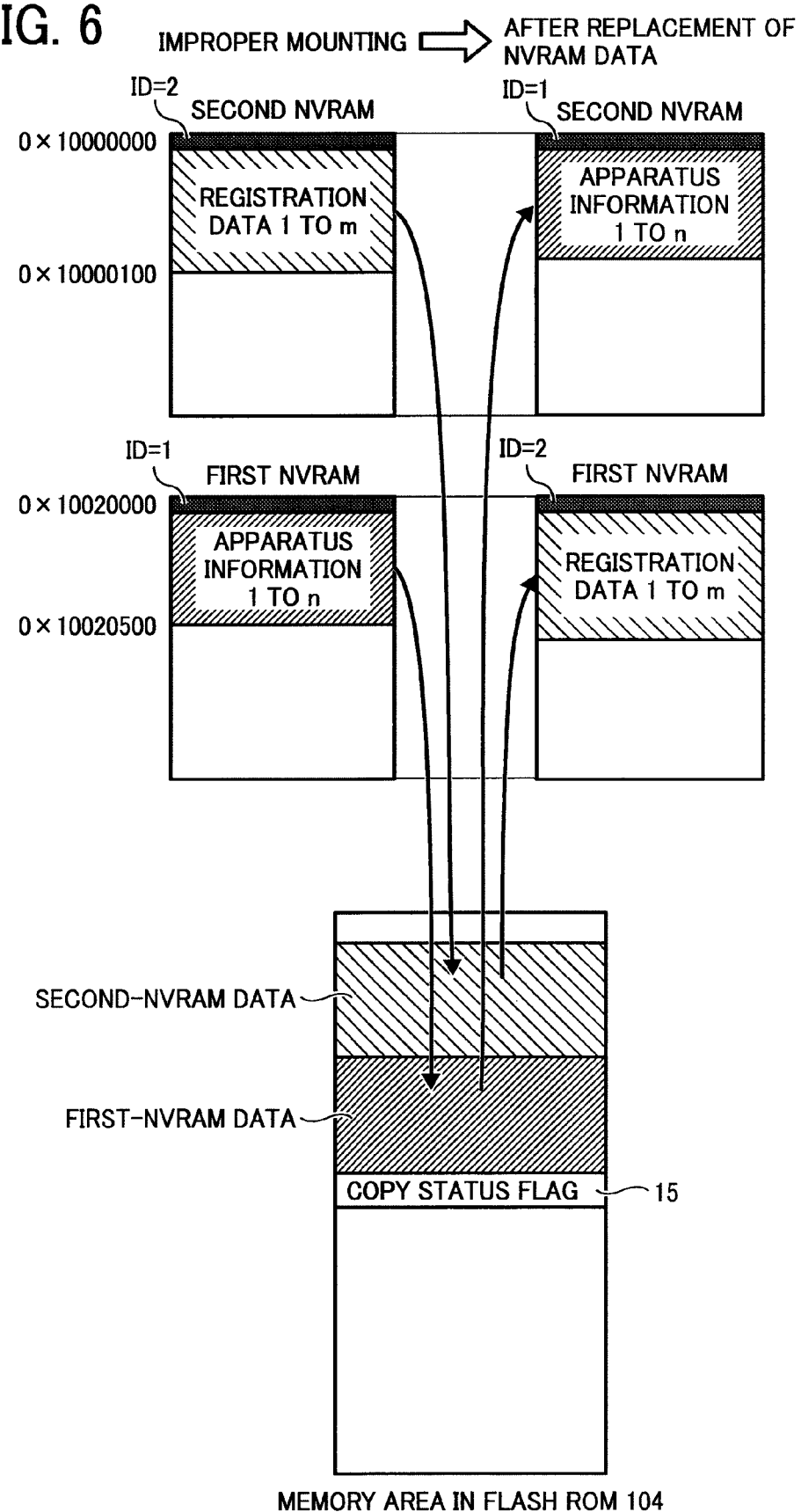
FIG. 6 is an explanatory diagram for explaining a data replacing process performed by the recording control apparatus according to the second embodiment when two NVRAMs are mounted in wrong positions.

Subsequently, the operations of the data replacing unit 112 and the data-replacement status determining unit 113 are explained in detail below. FIG. 6 is an explanatory diagram for explaining a data replacing process performed by the recording control apparatus 200 when the first and second NVRAMs 105 and 106 are mounted in the wrong positions. In a case shown in FIG. 6, the second NVRAM 106 is mistakenly attached to the first NVRAM I/F 117a, and the first NVRAM 105 is mistakenly attached to the second NVRAM I/F 117b. Incidentally, in this case, the first NVRAM 105 originally stores therein apparatus information 1 to n, and the second NVRAM 106 originally stores therein registration data 1 to m.

As shown in FIG. 6, the flash ROM 104 is set aside for a buffer. The data replacing unit 112 copies data stored in each of the first and second NVRAMs 105 and 106 onto the buffer temporarily.

Specifically, the data replacing unit 112 copies the registration data 1 to m stored in the second NVRAM 106, which is mistakenly mounted in the first NVRAM I/F 117a, onto the buffer (see second-NVRAM data), and copies the apparatus information 1 to n stored in the first NVRAM 105, which is mistakenly mounted in the second NVRAM I/F 117b, onto the buffer (see first-NVRAM data).

Then, the data replacing unit 112 erases the registration data 1 to m from the second NVRAM 106, and transfers the apparatus information 1 to n (the first-NVRAM data) temporarily-stored in the buffer onto the second NVRAM 106.

Likewise, the data replacing unit 112 erases the apparatus information 1 to n from the first NVRAM 105, and transfers the registration data 1 to m (the second-NVRAM data) temporarily-stored in the buffer onto the first NVRAM 105.

By the data replacement, even when the first and second NVRAMs 105 and 106 are mounted in the wrong positions, it is possible to access to correct data.

Furthermore, as shown in FIG. 6, a predetermined memory address of the flash ROM 104 is set aside for a copy status flag 15. The data replacing unit 112 sets a flag indicating whether the data replacement is complete in the copy status flag 15. In the present embodiment, when the data replacement is started, the data replacing unit 112 writes "1" on the copy status flag 15. When the data replacement is complete, the data replacing unit 112 writes "0" on the copy status flag 15. Therefore, the data-replacement status determining unit 113 can determine whether the data replacement is successfully complete by referring to the copy status flag 15. In other words, when the copy status flag 15 indicates "0", the data-replacement status determining unit 113 determines that the data replacement is successfully complete. On the other hand, when the copy status flag 15 indicates "1", the data-replacement status determining unit 113 determines that the data replacement is in processing or abnormally terminated. Even if the data transfer is interrupted due to any cause, the data is buffered in the flash ROM 104. Therefore, when the image forming apparatus is rebooted, the data transfer from the flash ROM 104 to each of the first and second NVRAMs 105 and 106 can be restarted immediately.

Figure 7:
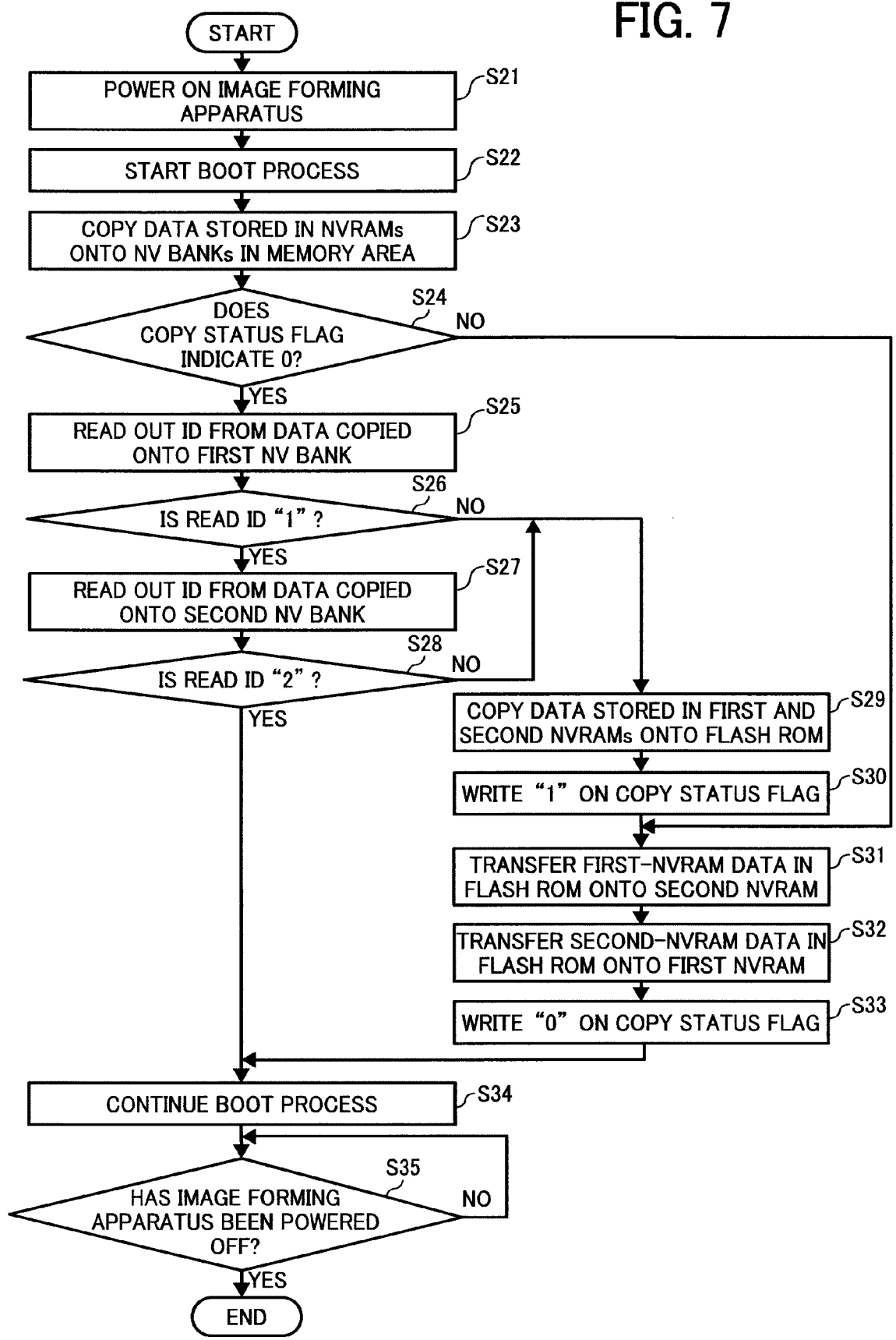
FIG. 7 is a flowchart of a data protecting process, including the data replacing process, performed by the recording control apparatus according to the second embodiment.

Subsequently, a data protecting process, including the data replacing process, performed by the recording control apparatus 200 is explained in detail below with reference to a flowchart shown in FIG. 7.

When the image forming apparatus is powered on by a user (Step S21), a boot process of the image forming apparatus is started (Step S22), and the recording control apparatus 200 gets into an active state.

The CPU 101 of the recording control apparatus 200 copies data stored in an NVRAM that is attached to the first NVRAM I/F 117a onto the first NV bank 11a in the memory area 11, and copies data stored in an NVRAM that is attached to the second NVRAM I/F 117b onto the second NV bank 11b in the memory area 11 (Step S23).

After that, the data-replacement status determining unit 113 reads out the copy status flag 15 in the flash ROM 104, and determines whether the copy status flag 15 indicates "0" (successful completion) (Step S24).

When the copy status flag 15 does not indicate "0" (NO at Step S24), the process control goes to Steps S31 to perform the data replacing process.

On the other hand, when the copy status flag 15 indicates "0" (YES at Step S24), the determining unit 108 reads out an ID from the data copied onto the first NV bank 11a (hereinafter, "a first read ID") (Step S25), and determines whether the first read ID is "1" (Step S26).

When the first read ID is not "1" (NO at Step S26), the process control goes to Steps S29 to perform the data replacing process.

On the other hand, when the first read ID is "1" (YES at Step S26), the determining unit 108 reads out an ID from the data copied onto the second NV bank 11b (hereinafter, "a second read ID") (Step S27), and determines whether the second read ID is "2" (Step S28).

When the second read ID is not "2" (NO at Step S28), the process control goes to Steps S29 to perform the data replacing process.

On the other hand, when the second read ID is "2" (YES at Step S28), the boot process of the image forming apparatus is continued, i.e., the boot control unit 111 does not stop the boot process of the image forming apparatus (Step S34).

After that, the boot control unit 111 confirms whether the image forming apparatus has been powered off (Step S35). When it is confirmed that the image forming apparatus has been powered off (YES at Step S35), the data protecting process performed by the recording control apparatus 200 is complete.

The data replacing process at Steps S29 to S33 is explained below. First, the data replacing unit 112 copies data stored in each of the first and second NVRAMs 105 and 106 onto the flash ROM 104 (Step S29). After that, the data replacing unit 112 writes "1" indicating during the data replacement on the copy status flag 15 in the flash ROM 104 (Step S30).

Then, the data replacing unit 112 transfers first-NVRAM data in the flash ROM 104 onto the second NVRAM 106 (Step S31), and transfers second-NVRAM data in the flash ROM 104 onto the first NVRAM 105 (Step S32). After that, the data replacing unit 112 writes "0" indicating successful completion of the data replacement on the copy status flag 15 in the flash ROM 104 (Step S33). When the data replacing process at Steps S29 to S33 is complete, the process control goes to Step S34.

In this manner, in the second embodiment, when the first and second NVRAMs 105 and 106 are mounted in the wrong positions, the recording control apparatus 200 replaces data stored in the first and second NVRAMs 105 and 106 by that is stored in the other NVRAM. Therefore, even when the first and second NVRAMs 105 and 106 are mounted in the wrong positions, it is not necessary to put the first and second NVRAMs 105 and 106 back in the right positions. Thus, the image forming apparatus including the recording control apparatus 200 can be automatically booted up without a hitch.

For example, when such data transfer is performed between the NVRAMs directly or when the data transfer is performed by using a dynamic RAM (DRAM) as a buffer, there is a risk that data is not protected at the time of power discontinuity or the like. However, the recording control apparatus 200 according to the second embodiment can avoid such a risk.

In the second embodiment, when the first and second NVRAMs 105 and 106 are mounted in the wrong positions, data stored in the first and second NVRAMs 105 and 106 is replaced by that is stored in the other NVRAM, and thereby protecting the data. In a third embodiment, when the first and second NVRAMs 105 and 106 are mounted in the wrong positions, the ID table 12 is revised thereby protecting data stored in the first and second NVRAMs 105 and 106.

Figure 8:
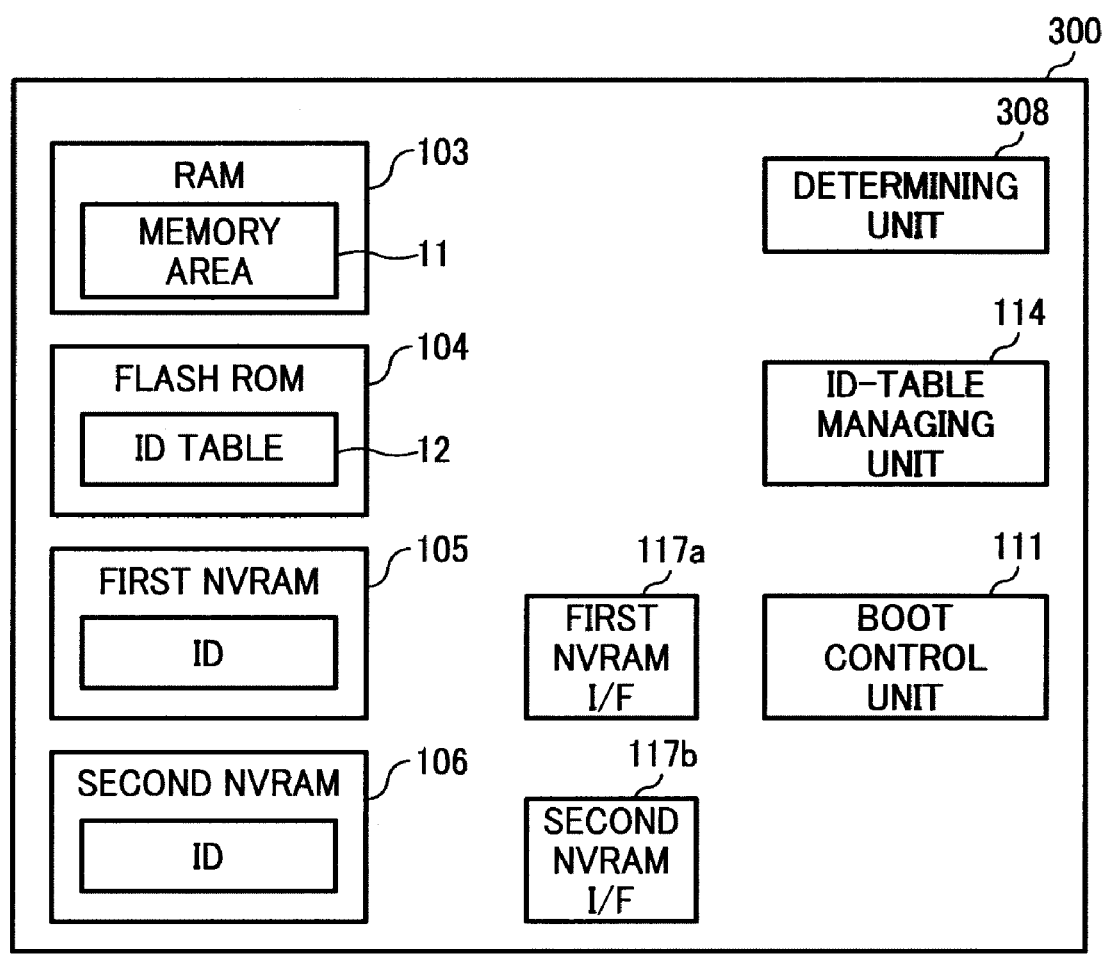
FIG. 8 is a functional block diagram of a recording control apparatus according to a third embodiment of the present invention.

FIG. 8 is a functional block diagram of a recording control apparatus 300 according to the third embodiment of the present invention. The recording control apparatus 300 includes a determining unit 308, an ID-table managing unit 114, the boot control unit 111, the RAM 103, the flash ROM 104, the first NVRAM 105, the second NVRAM 106, the first NVRAM I/F 117a, and the second NVRAM I/F 117b. The portions identical to those in FIG. 2 are denoted with the same reference numerals, and the description of those portions is omitted. Furthermore, a hardware configuration of the recording control apparatus 300 is identical to that of the recording control apparatus 100 shown in FIG. 1, and the description of the hardware configuration of the recording control apparatus 300 is omitted.

The determining unit 308 determines whether the first and second NVRAMs 105 and 106 are mounted in the right positions on the control board, i.e., are attached to the first and second NVRAM I/Fs 117a and 117b respectively by referring to the IDs stored in the first and second NVRAMs 105 and 106 and the ID table 12 stored in the flash ROM 104 when the boot process of the image forming apparatus is started.

The determining unit 308 further determines whether IDs read out from the data copied onto the first and second NV banks 11*a* and 11*b* (hereinafter, "first and second read IDs") are 0, i.e., a default value. The reasons why whether the first and second read IDs are the default value is determined are explained below. In the conventional technologies, an ID is written on an NVRAM in the last stage of the manufacturing process. However, such an operation complicates the parts management in the manufacturing factory, and also causes the increase in production cost. Therefore, in the present embodiment, it is configured to determine whether a read ID is 0, and thereby determining whether an ID is preset in each of the first and second NVRAMs 105 and 106 at the factory. When it is determined that an ID is not preset in each of the first and second NVRAMs 105 and 106 at the factory, i.e., first and second read IDs are both 0, an ID is written on each of the first and second NVRAMs 105 and 106. Therefore, it is not necessary to write an ID on each of NVRAMs at the factory. Thus, it is possible to reduce the production cost. In addition, in the parts management, it is not necessary to manage IDs to be assigned to the NVRAMs at the factory. Therefore, it is possible to reduce management burdens.

When the determining unit 308 determines that the first and second NVRAMs 105 and 106 are mounted in the wrong positions, the ID-table managing unit 114 revises the ID table 12 so that the preset IDs in the ID table 12 are matched with the first and second read IDs read out from data copied onto the first and second NV banks 11*a* and 11*b*. The operation of the ID-table managing unit 114 will be explained in detail later.

After the ID table 12 is revised by the ID-table managing unit 114, the boot control unit 111 boots up the image forming apparatus.

Figure 9:
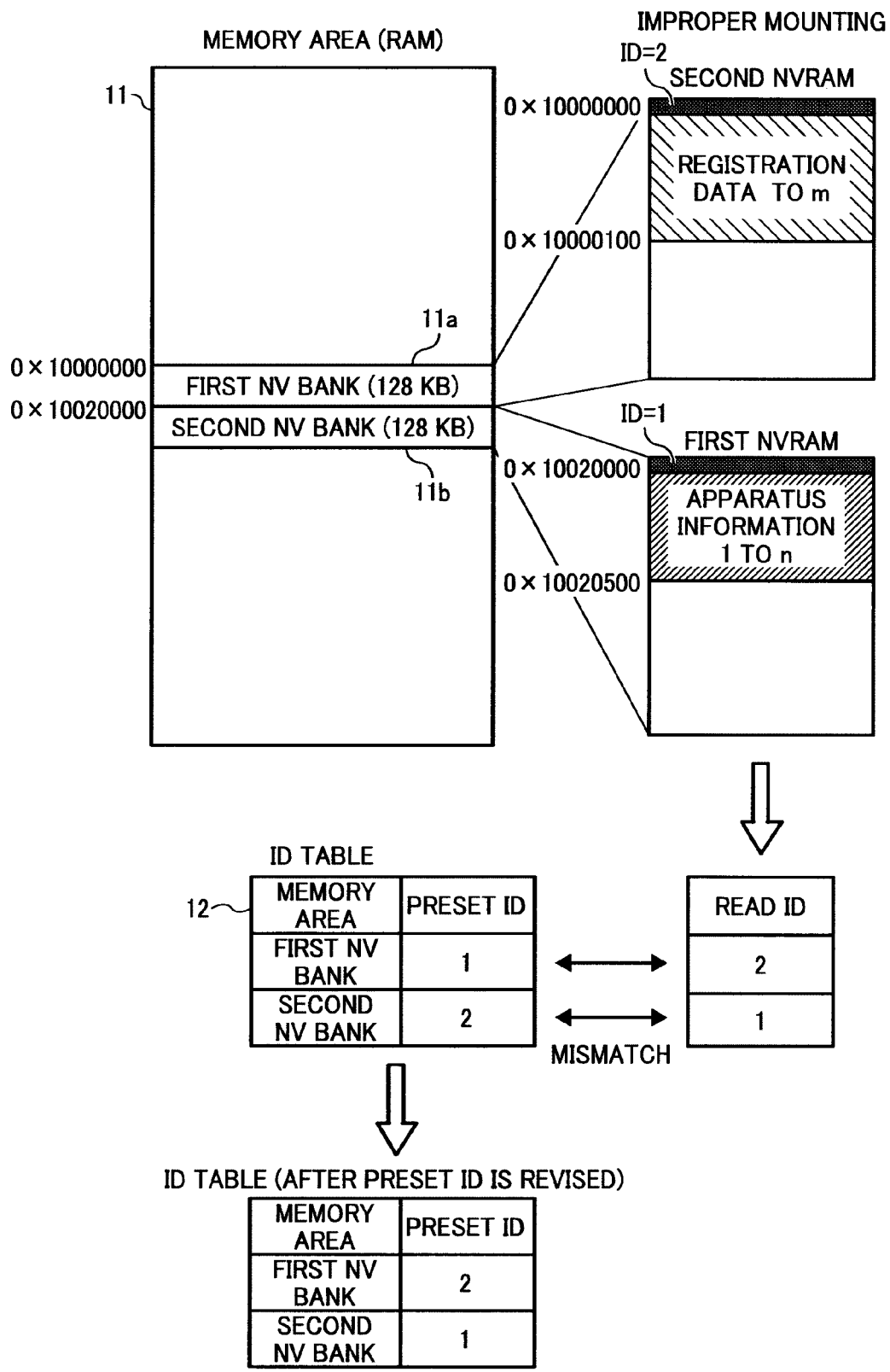
FIG. 9 is an explanatory diagram for explaining an ID-table revising process performed by the recording control apparatus according to the third embodiment when two NVRAMs are mounted in wrong positions.

Subsequently, the operation of the ID-table managing unit 114 is explained in detail below. FIG. 9 is an explanatory diagram for explaining an ID-table revising process performed by the recording control apparatus 300 when the first and second NVRAMs 105 and 106 are mounted in the wrong positions. In a case shown in FIG. 9, the second NVRAM 106 is mistakenly attached to the first NVRAM I/F 117*a*, and the first NVRAM 105 is mistakenly attached to the second NVRAM I/F 117*b*.

As shown in FIG. 9, the ID table 12 includes data on a preset ID of each NVRAM and a sub-area in the memory area 11 where data stored in the NVRAM having the preset ID is copied in a corresponding manner. Namely, the ID table 12 shown in FIG. 9 shows that when the data stored in the first NVRAM 105 having the ID of 1 is stored in the first NV bank 11*a*, and the data stored in the second NVRAM 106 having the ID of 2 is stored in the second NV bank 11*b*, it can be said that the first and second NVRAMs 105 and 106 are mounted in the right positions.

When the determining unit 308 determines that the first and second NVRAMs 105 and 106 are mounted in the wrong positions based on a result of comparison between the first and second read IDs and the preset IDs in the ID table 12, the ID-table managing unit 114 revises the ID table 12 as follows. The preset ID corresponding to the first NV bank 11*a* is revised from 1 as a default ID to 2, and the preset ID corresponding to the second NV bank 11*b* is revised from 2 as a default ID to 1.

After the revision of the ID table 12, the ID table 12 shows that the data stored in the second NVRAM 106 is stored in the first NV bank 11*a*, and the data stored in the first NVRAM 105 is stored in the second NV bank 11*b*. Therefore, the CPU 101 can access to a correct address of the memory area 11.

Figure 10:
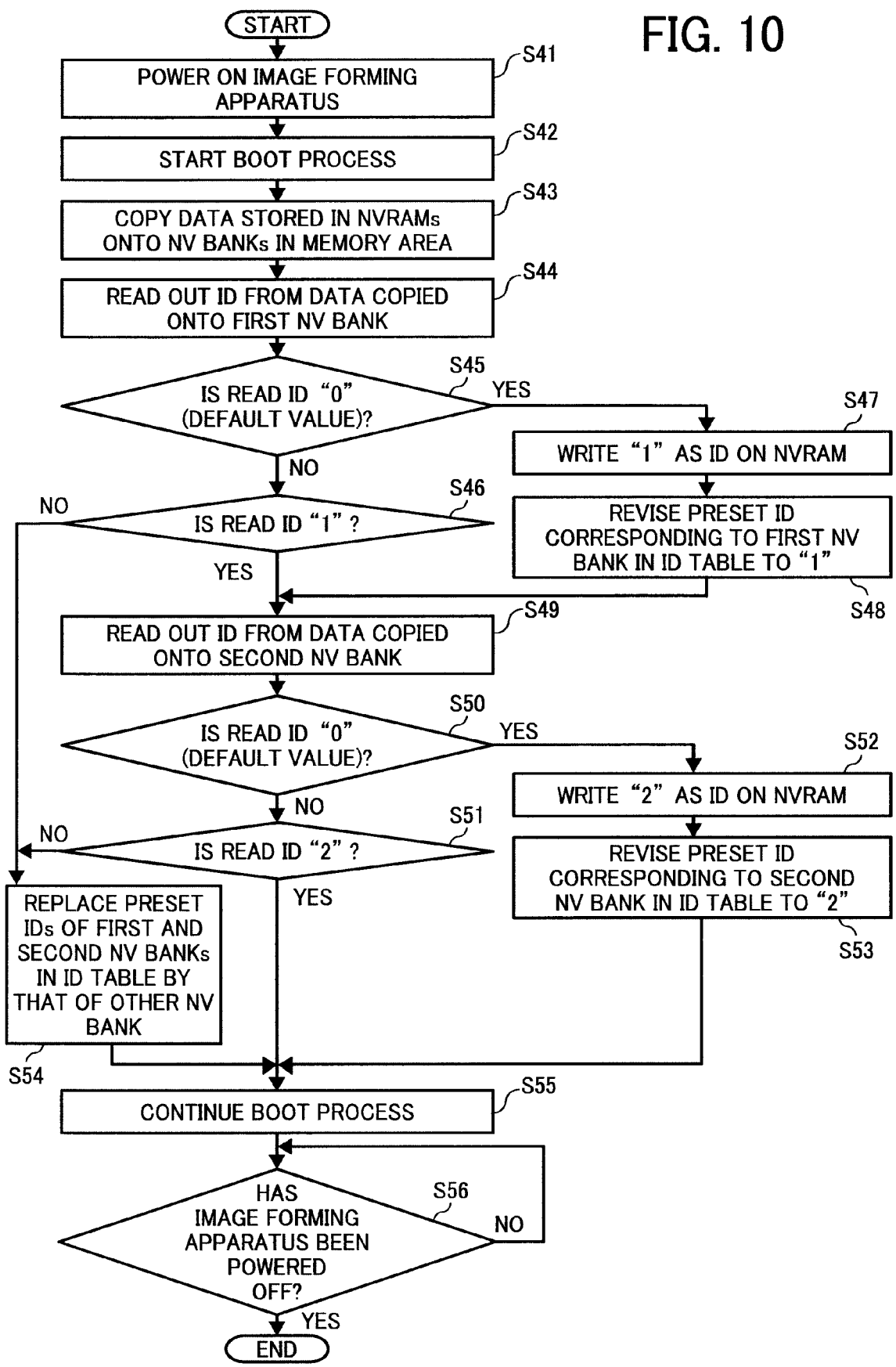
FIG. 10 is a flowchart of a data protecting process, including the ID-table revising process, performed by the recording control apparatus according to the third embodiment.

Subsequently, a data protecting process, including the ID-table revising process, performed by the recording control apparatus 300 is explained in detail below with reference to a flowchart shown in FIG. 10.

When the image forming apparatus is powered on by a user (Step S41), a boot process of the image forming apparatus is started (Step S42), i.e., the recording control apparatus 300 gets into an active state.

The CPU 101 of the recording control apparatus 300 copies data stored in an NVRAM that is attached to the first NVRAM I/F 117*a* onto the first NV bank 11*a* in the memory area 11, and copies data stored in an NVRAM that is attached to the second NVRAM I/F 117*b* onto the second NV bank 11*b* in the memory area 11 (Step S43).

After that, the determining unit 308 reads out an ID from the data copied onto the first NV bank 11*a* (hereinafter, "a first read ID") (Step S44), and determines whether the first read ID is 0, i.e., the default value (Step S45).

When the first read ID is the default value (YES at Step S45), it means that an ID is not preset in the NVRAM at the factory, so that the ID-table managing unit 114 writes "1" on the NVRAM attached to the first NVRAM I/F 117*a* as the ID of the NVRAM (Step S47), and revises the preset ID corresponding to the first NV bank 11*a* in the ID table 12 to "1" (Step S48).

On the other hand, when the first read ID is not the default value (NO at Step S45), the determining unit 308 further determines whether the first read ID is 1 (Step S46).

When the first read ID is not 1 (NO at Step S46), the process control goes to Step S54. On the other hand, when the first read ID is 1 (YES at Step S46), the determining unit 308 reads out an ID from the data copied onto the second NV bank 11*b* (hereinafter, "a second read ID") (Step S49), and determines whether the second read ID is 0, i.e., the default value (Step S50).

When the second read ID is the default value (YES at Step S50), the ID-table managing unit 114 writes "2" on the NVRAM attached to the second NVRAM I/F 117*b* as the ID of the NVRAM (Step S52), and revises the preset ID corresponding to the second NV bank 11*b* in the ID table 12 to "2" (Step S53).

On the other hand, when the second read ID is not the default value (NO at Step S50), the determining unit 308 further determines whether the second read ID is 2 (Step S51).

When the second read ID is not 2 (NO at Step S51), the process control goes to Step S54. On the other hand, when the second read ID is 2 (YES at Step S51), the boot process of the image forming apparatus is continued, i.e., the boot control unit 111 does not stop the boot process of the image forming apparatus (Step S55).

At Step S54, the ID-table managing unit 114 revises the ID table 12 by replacing the preset IDs of the first and second NV banks 11*a* and 11*b* in the ID table 12 by that of the other NV bank.

After the ID table 12 is revised at Step S54, the boot process of the image forming apparatus is continued, i.e., the boot control unit 111 does not stop the boot process of the image forming apparatus (Step S55).

After that, the boot control unit 111 confirms whether the image forming apparatus has been powered off (Step S56). When it is confirmed that the image forming apparatus has been powered off (YES at Step S56), the data protecting process performed by the recording control apparatus 300 is complete.

In the present embodiment, when the first and second NVRAMs 105 and 106 are mounted in the wrong positions, the preset IDs of the first and second NV banks 11a and 11b in the ID table 12 are replaced by that of the other NV bank at Step S54. However, the revision of the ID table 12 is not limited to the replacement of the preset IDs. As long as data included in the ID table 12 is matched with the locations, i.e., the first and second NV banks 11a and 11b where data stored in the first and second NVRAMs 105 and 106 are actually copied, the ID table 12 can be revised in other ways. For example, at Step S54, the ID-table managing unit 114 can replace preset addresses of the first and second NV banks 11a and 11b by that of the other NV bank, and thereby revising the ID table 12.

In the second embodiment, there remains such issues that it takes some time to replace data stored in two NVRAMs by that is stored in the other NVRAM, the reliability during copy of data is not ensured sufficiently, and the NVRAMs need to set aside a space for the copy of data. In the third embodiment, the above issues are solved, and the security level for protecting the data stored in the NVRAMs is improved.

Moreover, in the third embodiment, whether IDs read out from data copied onto the first and second NV banks 11a and 11b (first and second read IDs) are 0, i.e., the default value is determined, and thereby determining whether an ID is preset in each of the first and second NVRAMs 105 and 106 at the factory. When it is determined that any of the first and second read IDs is 0, a corresponding ID is written on the NVRAM. Therefore, it is not necessary to write IDs on the first and second NVRAMs 105 and 106 at the factory. Thus, it is possible to reduce the production cost. In addition, in the parts management of the first and second NVRAMs 105 and 106 at the factory, it is not necessary to manage IDs to be assigned to the first and second NVRAMs 105 and 106. Therefore, it is possible to reduce management burdens.

In the first to third embodiments, two NVRAMs are used, and it is determined whether both of the NVRAMs are properly attached to two NVRAM I/Fs. In a fourth embodiment, a recording control apparatus includes one NVRAM, and it is determined whether the NVRAM is properly attached to any one of two NVRAM I/Fs. When the NVRAM is mistakenly attached to the incorrect NVRAM I/F, the recording control apparatus protects data stored in the NVRAM.

Figure 11:
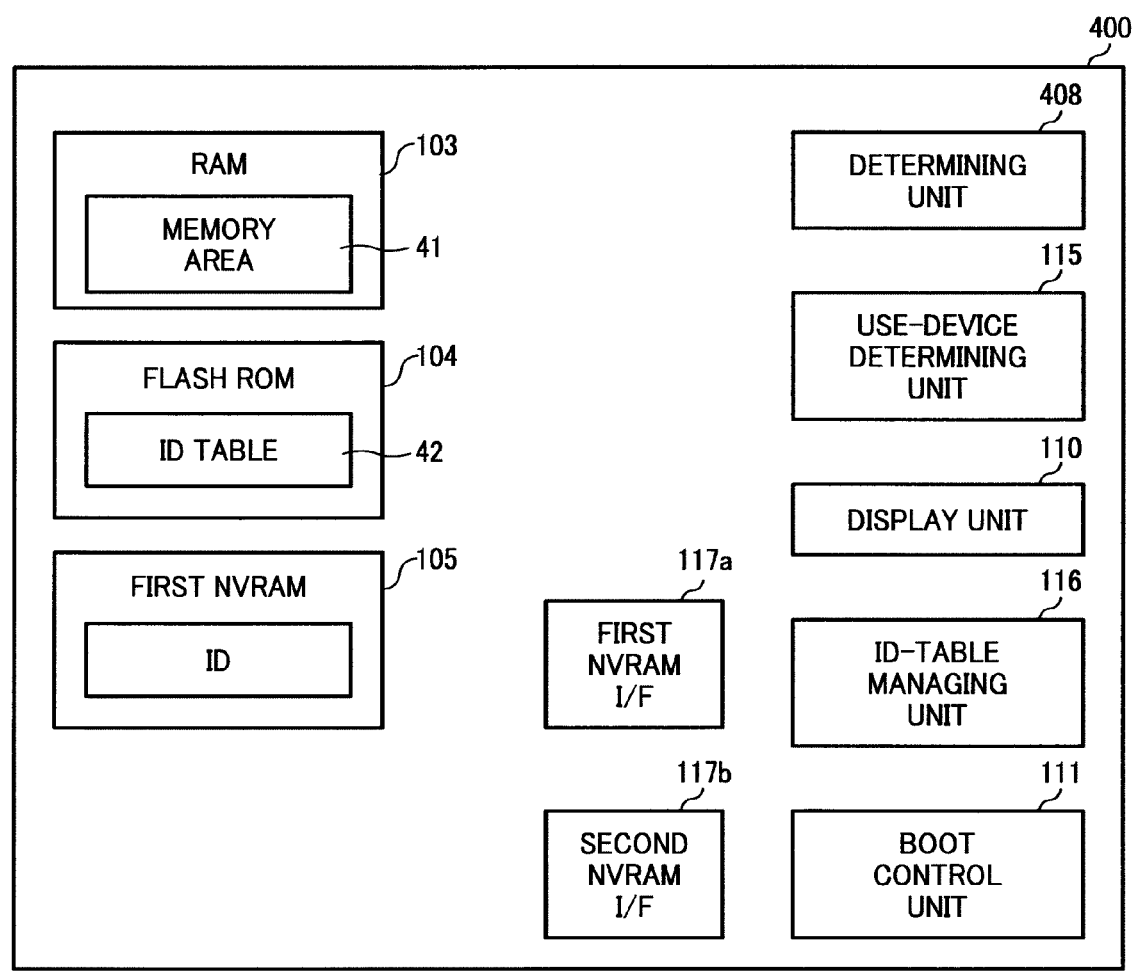
FIG. 11 is a functional block diagram of a recording control apparatus according to a fourth embodiment of the present invention.

FIG. 11 is a functional block diagram of a recording control apparatus 400 according to the fourth embodiment of the present invention. The recording control apparatus 400 includes a determining unit 408, a use-device determining unit 115, the display unit 110, an ID-table managing unit 116, the boot control unit 111, the RAM 103, the flash ROM 104, the first NVRAM 105, the first NVRAM I/F 117a, and the second NVRAM I/F 117b. The portions identical to those in FIG. 2 are denoted with the same reference numerals, and the description of those portions is omitted. Furthermore, a hardware configuration of the recording control apparatus 400 is identical to that of the recording control apparatus 100 shown in FIG. 1, and the description of the hardware configuration of the recording control apparatus 400 is omitted.

The use-device determining unit 115 determines whether each of the first and second NVRAMs 105 and 106 is set to be used when the boot process of the image forming apparatus is started.

When the use-device determining unit 115 determines that one NVRAM (in the present embodiment, the first NVRAM 105) is set to be used, the determining unit 408 determines whether the NVRAM is attached to any of two NVRAM I/Fs (the first and second NVRAM I/Fs 117a and 117b). The determining unit 408 further determines whether the NVRAM is mounted in the right position by comparing an ID stored in the NVRAM with a corresponding preset ID in an ID table 42 stored in the flash ROM 104. In addition, the determining unit 408 further determines whether the ID of the NVRAM is the default value in the same manner as in the third embodiment.

Specifically, the determining unit 408 determines whether the NVRAM is attached to the first NVRAM I/F 117a by determining whether an ID read out from data copied onto a first NV bank 41a is "0xFF". When the read ID is "0xFF", the determining unit 408 determines that no NVRAM is attached to the first NVRAM I/F 117a. Namely, first and second NV banks 41a and 41b in a memory area 41 of the RAM 103 are originally initialized at "0xFF". For example, when the first and second NVRAMs 105 and 106 are mounted regardless of in the right positions or in the wrong positions, data stored in the first and second NVRAMs 105 and 106 is copied onto any of the first and second NV banks 41a and 41b. Therefore, when first and second read IDs are not "0xFF", the determining unit 408 can determine that the first and second NVRAMs 105 and 106 are mounted.

Furthermore, when determining that the first NVRAM 105 are mounted, the determining unit 408 further determines whether the first and second NVRAMs 105 and 106 are mounted in the right positions by determining whether the first and second read IDs are matched with the preset IDs in the ID table 42. For example, when the first read ID is 2 although the preset ID corresponding to the first NV bank 41a in the ID table 42 is 1, the determining unit 408 determines that the NVRAM attached to the first NVRAM I/F 117a is mounted in the wrong position.

When the determining unit 408 determines that no NVRAM is attached to the first NVRAM I/F 117a or the second NVRAM I/F 117b, the display unit 110 displays an error message indicating the mismatch between the read ID and the preset ID on the operation screen of the image forming apparatus, and thereby warning a user.

When the determining unit 408 determines that the read ID is "0xFF", i.e., an initial value, the ID-table managing unit 116 revises the ID table 42 so that the preset ID corresponds to the read ID, i.e., "0xFF". Furthermore, when the determining unit 408 determines that the NVRAM is mistakenly attached to the incorrect NVRAM I/F, the ID-table managing unit 116 revises the ID table 42 so that the preset ID in the ID table 42 corresponds to the read ID. The operation of the ID-table managing unit 116 will be explained in detail later.

When the display unit 110 displays the error message, the boot control unit 111 stops the boot process of the image forming apparatus.

The flash ROM 104 stores therein the ID table 42. The ID table 42 includes data on a preset ID of each NVRAM and a sub-area in the memory area 41 where data stored in the NVRAM having the preset ID is copied in a corresponding manner. The ID table 42 is identical to the ID table 12 used in the first to third embodiments.

Subsequently, when it is configured to use one NVRAM to boot up the image forming apparatus, a case where no NVRAM is attached to a valid NVRAM I/F is explained below.

Figure 12:
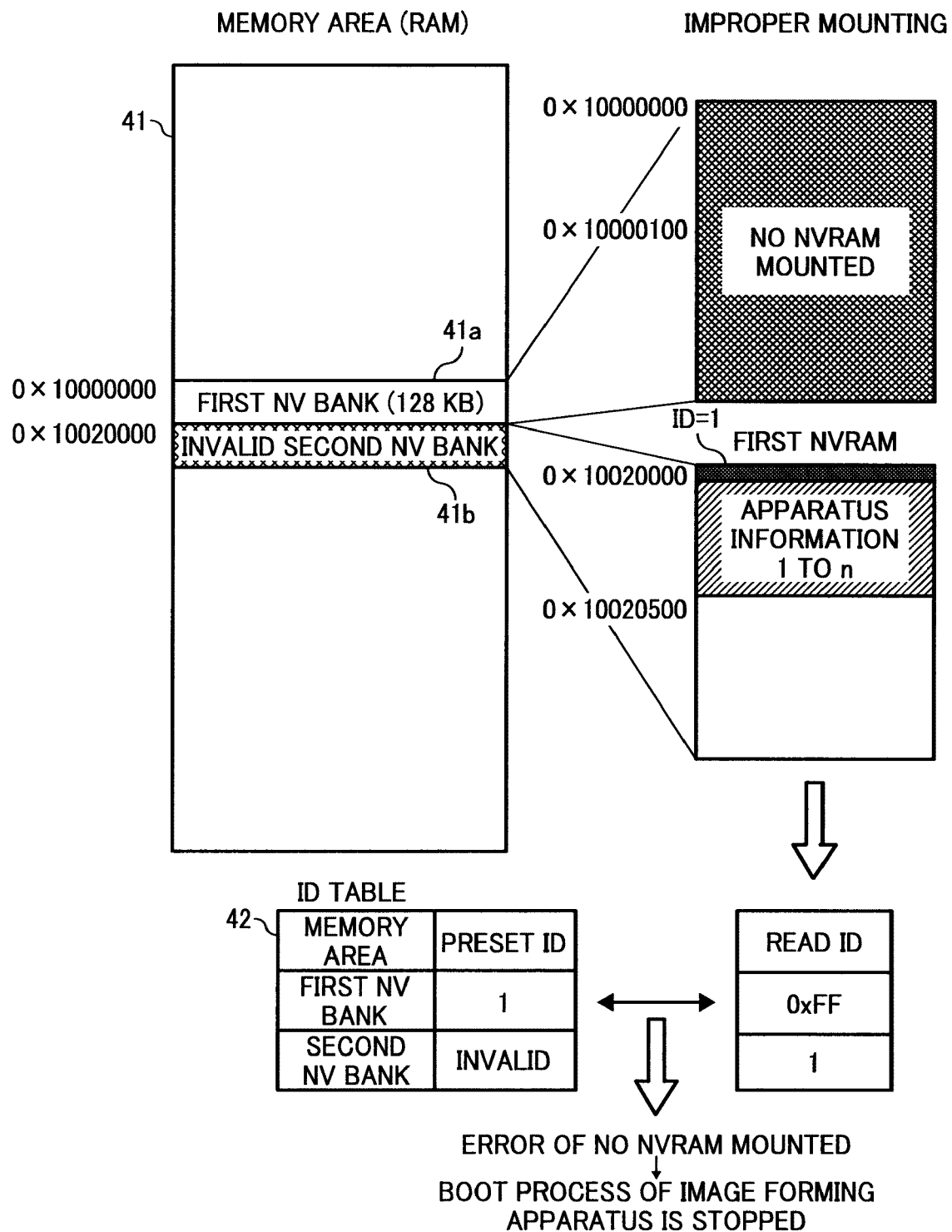
FIG. 12 is an explanatory diagram of an example of a memory area of a RAM and an ID table when no NVRAM is attached to a valid NVRAM I/F in the recording control apparatus according to the fourth embodiment.

FIG. 12 is an explanatory diagram of an example of the memory area 41 in the RAM 103 and the ID table 42 when no NVRAM is attached to a valid NVRAM I/F in the recording control apparatus 400. Specifically, in this example, under such a condition that the recording control apparatus 400 uses only the first NVRAM 105 to boot up the image forming apparatus, the first NVRAM 105 is not attached to the valid first NVRAM I/F 117a. In other words, no NVRAM is attached to the valid first NVRAM I/F 117a, and the first NVRAM 105 is mistakenly attached to the invalid second NVRAM I/F 117b.

In the example shown in FIG. 12, although the first NVRAM I/F 117a is set to be used (i.e., valid), and the second NVRAM I/F 117b is set not to be used (i.e., invalid), the first NVRAM 105 is attached not to the valid first NVRAM I/F 117a but to the invalid second NVRAM I/F 117b. In this state, when the boot process of the image forming apparatus is started, as shown in FIG. 12, no data is copied onto the first NV bank 41a, and data stored in the first NVRAM 105, which is supposed to be copied onto the first NV bank 41a, is incorrectly copied onto the second NV bank 41b.

In this case, however, as shown in FIG. 12, an ID read out from the first NV bank 41a (hereinafter, "a first read ID") is "0xFF", so that the determining unit 408 determines that the first NVRAM 105 is not mounted. Then, the display unit 110 displays an error message, and the boot control unit 111 stops the boot process of the image forming apparatus.

Subsequently, when it is configured to use one NVRAM to boot up the image forming apparatus, a case where an incorrect NVRAM is mounted in the recording control apparatus 400 is explained below.

Figure 13:
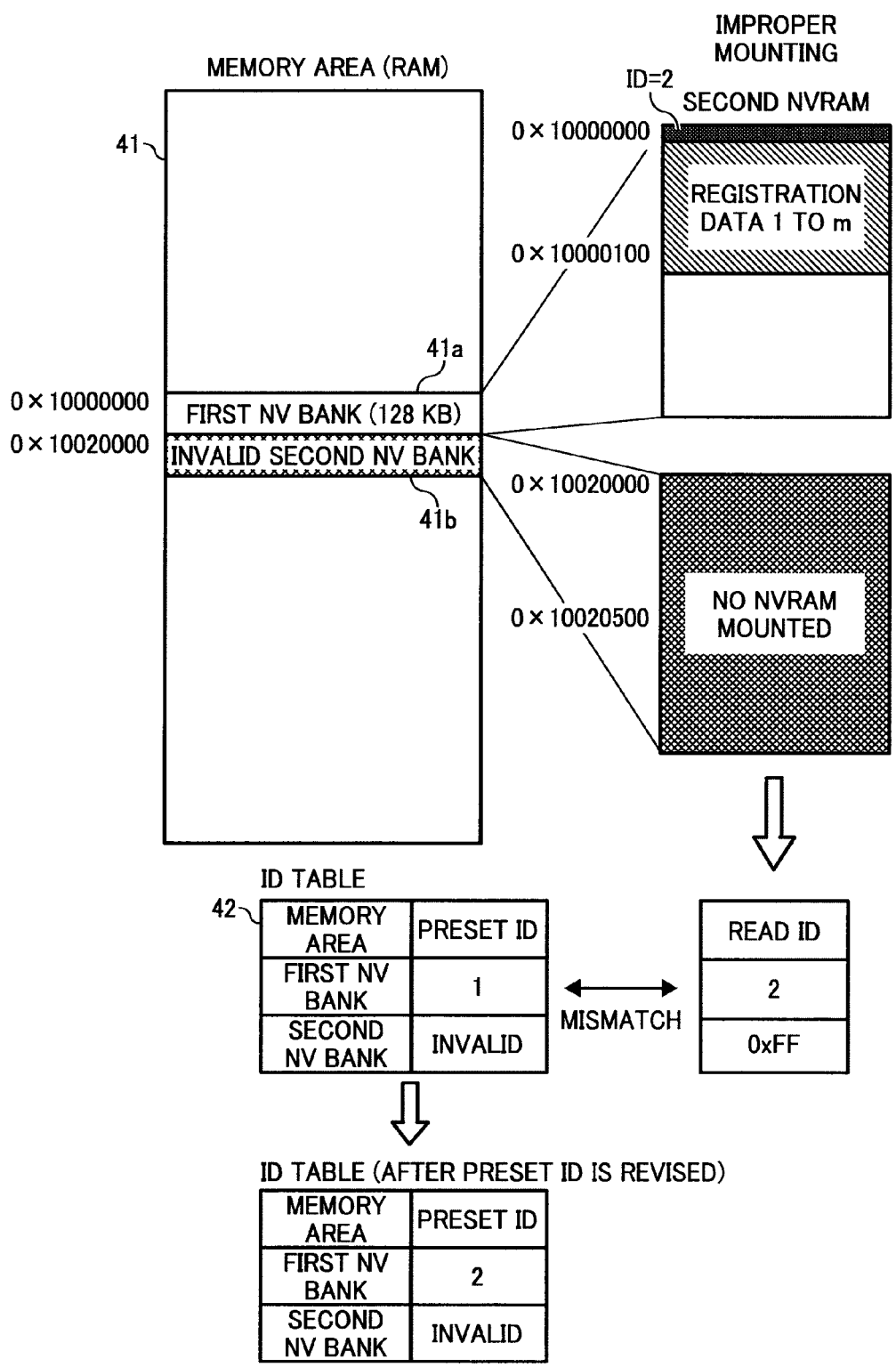
FIG. 13 is an explanatory diagram of an example of the memory area of the RAM and the ID table when an incorrect NVRAM is attached to the valid NVRAM I/F in the recording control apparatus according to the fourth embodiment.

FIG. 13 is an explanatory diagram of an example of the memory area 41 in the RAM 103 and the ID table 42 when an incorrect NVRAM is attached to a valid NVRAM I/F in the recording control apparatus 400. Specifically, in this example, under such a condition that the recording control apparatus 400 uses only the first NVRAM 105 to boot up the image forming apparatus, the second NVRAM 106 is mistakenly attached to the valid first NVRAM I/F 117a. As shown in FIG. 13, data stored in the second NVRAM 106, which is supposed to be copied onto the second NV bank 41b, is incorrectly copied onto the first NV bank 41a. Incidentally, the second NV bank 41b is invalid (i.e., is set not to be used).

In this case, as shown in FIG. 13, the preset ID corresponding to the first NV bank 41a in the ID table 42 (in this example, "1") is not matched with an ID read out from the data copied onto the first NV bank 41a (in this example, "2"), so that the determining unit 408 determines that the second NVRAM 106 is mounted in the wrong position. In this case, the ID-table managing unit 116 erases the preset ID of 1 in the ID table 42, and resets the same ID as the read ID of 2 as the preset ID corresponding to the first NV bank 41a in the ID table 42. In this manner, the ID-table managing unit 116 revises the ID table 42 so that the preset ID corresponds to the read ID even though the incorrect NVRAM is mounted mistakenly.

Figure 14:
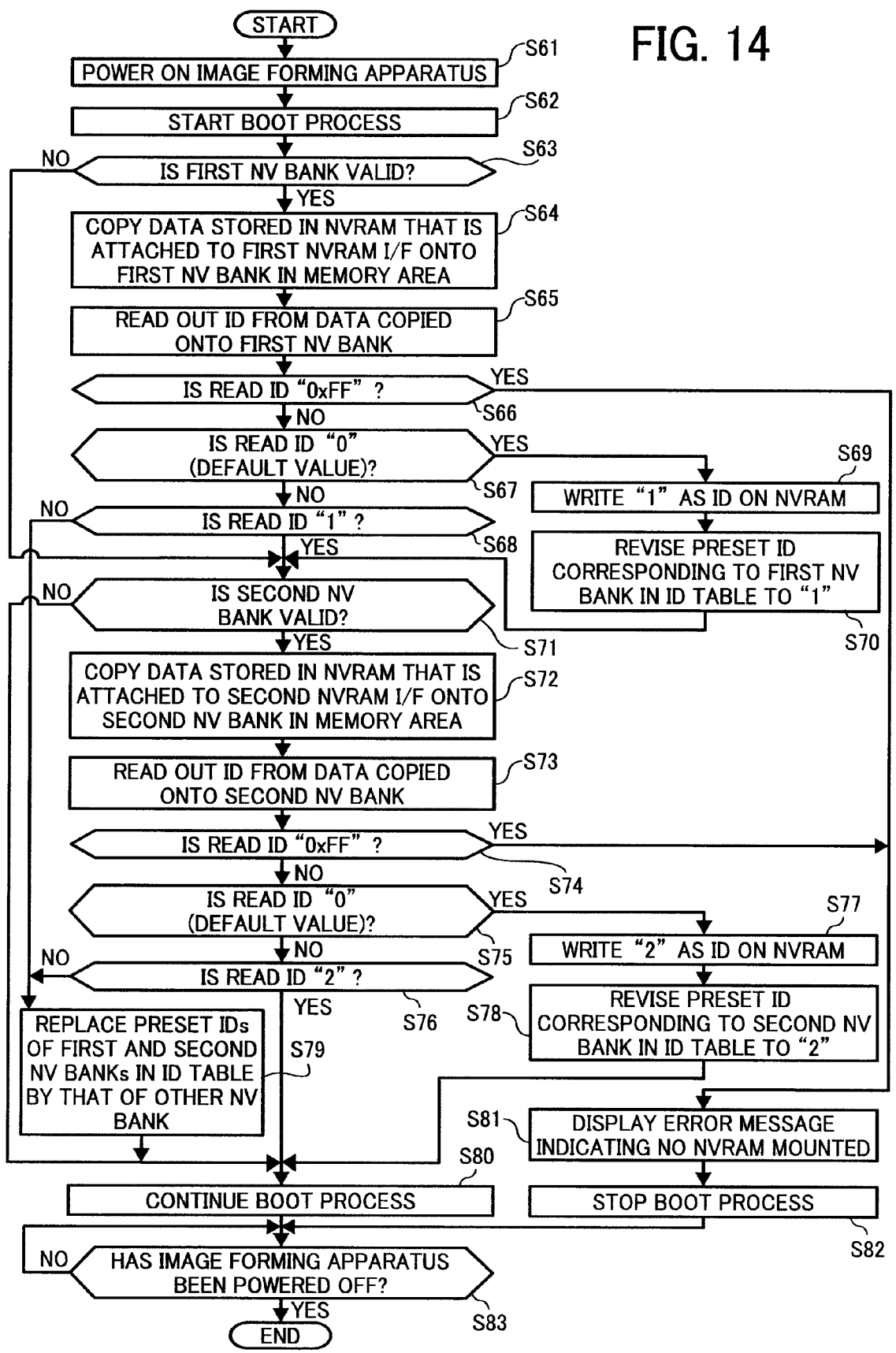
FIG. 14 is a flowchart of a data protecting process performed by the recording control apparatus according to the fourth embodiment.

Subsequently, a data protecting process performed by the recording control apparatus 400 is explained in detail below with reference to a flowchart shown in FIG. 14.

When the image forming apparatus is powered on by a user (Step S61), a boot process of the image forming apparatus is started (Step S62), and the recording control apparatus 400 gets into an active state.

The use-device determining unit 115 determines whether the first NV bank 41a is valid (Step S63).

When the use-device determining unit 115 determines that the first NV bank 41a is valid (YES at Step S63), the CPU 101 of the recording control apparatus 400 copies data stored in an NVRAM that is attached to the first NVRAM I/F 117a onto the first NV bank 41a (Step S64). After that, the determining unit 408 reads out an ID from the data copied onto the first NV bank 41a (hereinafter, "a first read ID") (Step S65).

On the other hand, when the use-device determining unit 115 determines that the first NV bank 41a is invalid (NO at Step S63), it means that the first NVRAM 105 is set not to be used, and the process control goes to Step S71.

After reading out the first read ID at Step S65, the determining unit 408 determines whether the first read ID is "0xFF" (Step S66).

When the first read ID is "0xFF", i.e., no NVRAM is attached to the first NVRAM I/F 117a (YES at Step S66), the process control goes to Step S81.

On the other hand, when the first read ID is not "0xFF", i.e., the NVRAM is attached to the first NVRAM I/F 117a (NO at Step S66), the determining unit 408 determines whether the first read ID is 0, i.e., the default value (Step S67).

When the first read ID is the default value, i.e., an ID is not preset in the NVRAM at the factory (YES at Step S67), the ID-table managing unit 116 writes "1" on the NVRAM attached to the first NVRAM I/F 117a as the ID of the NVRAM (Step S69), and revises the preset ID corresponding to the first NV bank 41a in the ID table 42 to "1" (Step S70).

On the other hand, when the first read ID is not the default value, i.e., an ID is preset in the NVRAM at the factory (NO at Step S67), the determining unit 408 further determines whether the first read ID is 1 (Step S68). When the first read ID is not 1 (NO at Step S68), the process control goes to Step S79.

On the other hand, when the first read ID is 1 (YES at Step S68) or upon completion of the process at Step S70, the use-device determining unit 115 determines whether the second NV bank 41b is valid (Step S71).

When the use-device determining unit 115 determines that the second NV bank 41b is valid (YES at Step S71), the CPU 101 of the recording control apparatus 400 copies data stored in an NVRAM that is attached to the second NVRAM I/F 117b onto the second NV bank 41b (Step S72). After that, the determining unit 408 reads out an ID from the data copied onto the second NV bank 41b (hereinafter, "a second read ID") (Step S73). On the other hand, when the use-device determining unit 115 determines that the second NV bank 41b is invalid (NO at Step S71), it means that the second NVRAM 106 is set not to be used, and the process control goes to Step S80.

After reading out the second read ID at Step S73, the determining unit 408 determines whether the second read ID is "0xFF" (Step S74).

When the second read ID is "0xFF", i.e., no NVRAM is attached to the second NVRAM I/F 117b (YES at Step S74), the process control goes to Step S81.

On the other hand, when the second read ID is not "0xFF", i.e., the NVRAM is attached to the second NVRAM I/F 117b (NO at Step S74), the determining unit 408 determines whether the second read ID is 0, i.e., the default value (Step S75).

When the second read ID is the default value, i.e., an ID is not preset in the NVRAM at the factory (YES at Step S75), the ID-table managing unit 116 writes "2" on the NVRAM attached to the second NVRAM I/F 117b as the ID of the NVRAM (Step S77), and revises the preset ID corresponding to the second NV bank 41b in the ID table 42 to "2" (Step S78).

On the other hand, when the second read ID is not the default value, i.e., an ID is preset in the NVRAM at the factory (NO at Step S75), the determining unit 408 further determines whether the second read ID is 2 (Step S76). When the second read ID is not 2 (NO at Step S76), the process control goes to Step S79. On the other hand, when the second read ID is 2 (YES at Step S76), the process control goes to Step S80.

At Step S79, the ID-table managing unit 116 revises the ID table 42 by replacing the preset IDs of the first and second NV banks 41*a* and 41*b* in the ID table 42 by that of the other NV bank.

After the process at Step S79, the boot process of the image forming apparatus is continued, i.e., the boot control unit 111 does not stop the boot process of the image forming apparatus (Step S80).

After the image forming apparatus is booted up or the boot process is stopped at Step S82, the boot control unit 111 confirms whether the image forming apparatus has been powered off (Step S83). When it is confirmed that the image forming apparatus has been powered off (YES at Step S83), the data protecting process performed by the recording control apparatus 400 is complete.

In the present embodiment, the preset IDs of the first and second NV banks 41*a* and 41*b* in the ID table 42 are replaced by that of the other NV bank at Step S79. Alternatively, it is also possible to replace addresses of the first and second NV banks 41*a* and 41*b* by that of the other NV bank at Step S79.

In the fourth embodiment, the recording control apparatus 400 uses one NVRAM to boot up the image forming apparatus. When no NVRAM is mounted, an error message is displayed. Therefore, a user can recognize that no NVRAM is mounted.

Furthermore, in the fourth embodiment, when one NVRAM is mounted to boot up the image forming apparatus, even if the NVRAM is mounted in the wrong position, it is possible to access an address of the NVRAM correctly, and thus it is possible to boot up the image forming apparatus. Consequently, it is possible to use the first and second NVRAM I/Fs 117*a* and 117*b* equivalently even though the first NVRAM I/F 117*a* has primacy over the second NVRAM I/F 117*b*.

Incidentally, a recording control program executed by the recording control apparatus according to any of the first to fourth embodiments can be preliminarily built into the memory unit, such as the ROM, of the recording control apparatus.

Alternatively, the recording control program can be stored in a computer-readable recording medium, such as a compact disk read-only memory (CD-ROM), a flexible disk (FD), a CD recordable (CD-R), or a digital versatile disk (DVD), in an installable or executable file format.

Furthermore, the recording control program can be stored on a computer connected to a network such as the Internet to be downloaded via the network. Moreover, the recording control program can be provided or distributed via the network.

The recording control program is composed of modules including the elements included in the recording control apparatus (i.e., the determining unit, the access control unit, the display unit, the boot control unit, the data replacing unit, the data-replacement status determining unit, the ID-table managing unit, and the use-device determining unit). The CPU as an actual hardware reads out the recording control program from the recording medium, and executes the recording control program, whereby the above elements are loaded on the main memory unit, i.e., the determining unit, the access control unit, the display unit, the boot control unit, the data replacing unit, the data-replacement status determining unit, the ID-table managing unit, and the use-device determining unit are created on the main memory unit.

According to an aspect of the present invention, even when a nonvolatile memory is mounted in a wrong position, data stored in the nonvolatile memory can be protected.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A recording control apparatus comprising:
a removable nonvolatile memory including a first nonvolatile memory and a second nonvolatile memory;
a determining unit that performs a position determination determining whether the removable nonvolatile memory is mounted in a right position or in a wrong position, the removable nonvolatile memory being mounted in the wrong position when the first nonvolatile memory is mounted in a position designated for the second nonvolatile memory and simultaneously the second nonvolatile memory is mounted in a position designated for the first nonvolatile memory; and
a protecting unit that protects data stored in the removable nonvolatile memory when the determining unit determines that the removable nonvolatile memory is mounted in the wrong position, the protecting unit including
a data replacing unit that replaces data stored in the first nonvolatile memory with data stored in the second nonvolatile memory and replaces the data stored in the second nonvolatile memory with the data stored in the first nonvolatile memory when the determining unit determines that the removable nonvolatile memory is mounted in the wrong position; and
a storing unit that includes a buffer area for storing the data stored in the first nonvolatile memory and the data stored in the second nonvolatile memory, wherein
when the determining unit determines that the removable nonvolatile memory is mounted in the wrong position, the data replacing unit copies the data stored in the first nonvolatile memory and the data stored in the second nonvolatile memory into the buffer area, erases the data stored in the first nonvolatile memory from the first nonvolatile memory, erases the data stored in the second nonvolatile memory from the second nonvolatile memory, transfers data previously stored in the first nonvolatile memory from the buffer area to the second nonvolatile memory, and transfers data previously stored in the second nonvolatile memory from the buffer area to the first nonvolatile memory.

2. The recording control apparatus according to claim 1, wherein after completing the transfer of data previously stored in the first nonvolatile memory from the buffer area to the second nonvolatile memory and the transfer of data previously stored in the second nonvolatile memory from the buffer area to the first nonvolatile memory, the data replacing unit sets a flag indicating completion of the transfer of data.

3. The recording control apparatus according to claim 1, further comprising a boot control unit that controls a boot process of a predetermined apparatus in which the recording control apparatus is installed, wherein
the determining unit performs the position determination at a time of starting the boot process of the predetermined apparatus, and
when the data previously stored in the first nonvolatile memory are transferred from the buffer area to the second nonvolatile memory and the data previously stored in the second nonvolatile memory are transferred from the buffer area to the first nonvolatile memory by the data replacing unit, the boot control unit reboots the predetermined apparatus.

4. The recording control apparatus according to claim 1, wherein
the storing unit includes a plurality of memory areas, the storing unit stores therein an identification table including memory identification data for uniquely identifying each of the first nonvolatile memory and the second nonvolatile memory and area identification data for each of the first nonvolatile memory and the second nonvolatile memory, the area identification data identifying one memory area as corresponding to the first nonvolatile memory and another memory area as corresponding to the second nonvolatile memory, and
the determining unit performs the position determination by referring to the identification table.

5. The recording control apparatus according to claim 4, wherein the protecting unit includes an identification-table managing unit that updates the identification table when the determining unit determines that the removable nonvolatile memory is mounted in the wrong position.

6. The recording control apparatus according to claim 1, wherein the protecting unit includes an informing unit that informs a user of a wrong mounting of the removable nonvolatile memory when the determining unit determines that the removable nonvolatile memory is mounted in the wrong position.

7. The recording control apparatus according to claim 1, wherein the protecting unit includes an access control unit that restricts an access to data stored in the removable nonvolatile memory when the determining unit determines that the removable nonvolatile memory is mounted in the wrong position.

8. The recording control apparatus according to claim 7, wherein the protecting unit includes an informing unit that informs a user of a wrong mounting of the removable nonvolatile memory when the determining unit determines that the removable nonvolatile memory is mounted in the wrong position.

9. The recording control apparatus according to claim 1, further comprising a boot control unit that controls a boot process of a predetermined apparatus in which the recording control apparatus is installed, wherein
the determining unit performs the position determination at a time of starting the boot process of the predetermined apparatus, and
the boot control unit aborts the boot process of the predetermined apparatus when the determining unit determines that the removable nonvolatile memory is mounted in the wrong position.

10. A method of controlling data recording in a recording control apparatus that includes a removable nonvolatile memory including a first nonvolatile memory and a second nonvolatile memory, the method comprising:
determining whether the removable nonvolatile memory is mounted in a right position or in a wrong position in the recording control apparatus, the removable nonvolatile memory being mounted in the wrong position when the first nonvolatile memory is mounted in a position designated for the second nonvolatile memory and simultaneously the second nonvolatile memory is mounted in a position designated for the first nonvolatile memory; and
protecting data stored in the removable nonvolatile memory when it is determined that the removable nonvolatile memory is mounted in the wrong position, protecting data including:
copying data stored in the first nonvolatile memory and data stored in the second nonvolatile memory into a buffer area of a storing unit;
erasing the data stored in the first nonvolatile memory from the first nonvolatile memory;
erasing the data stored in the second nonvolatile memory from the second nonvolatile memory;
transferring data previously stored in the first nonvolatile memory from the buffer area to the second nonvolatile memory; and
transferring data previously stored in the second nonvolatile memory from the buffer area to the first nonvolatile memory.

11. A non-transitory computer readable storage medium storing computer readable instructions thereon, which, when executed by a computer, cause the computer to perform a method for controlling data recording in a recording control apparatus that includes a removable nonvolatile memory including a first nonvolatile memory and a second nonvolatile memory, the method comprising:
determining whether the removable nonvolatile memory is mounted in a right position or in a wrong position in the recording control apparatus, the removable nonvolatile memory being mounted in the wrong position when the first nonvolatile memory is mounted in a position designated for the second nonvolatile memory and simultaneously the second nonvolatile memory is mounted in a position designated for the first nonvolatile memory; and
protecting data stored in the removable nonvolatile memory when it is determined that the removable nonvolatile memory is mounted in the wrong position, protecting data including:
copying data stored in the first nonvolatile memory and data stored in the second nonvolatile memory into a buffer area of a storing unit;
erasing the data stored in the first nonvolatile memory from the first nonvolatile memory;
erasing the data stored in the second nonvolatile memory from the second nonvolatile memory;
transferring data previously stored in the first nonvolatile memory from the buffer area to the second nonvolatile memory; and
transferring data previously stored in the second nonvolatile memory from the buffer area to the first nonvolatile memory.

12. The recording control apparatus according to claim 2, further comprising a data-replacement status determining unit that controls a boot process of a predetermined apparatus in which the recording control apparatus is installed according to the flag set by the data replacing unit.

* * * * *